(12) United States Patent
Teranishi et al.

(10) Patent No.: US 11,187,887 B2
(45) Date of Patent: Nov. 30, 2021

(54) ELECTRODE SUBSTRATE, METHOD FOR PRODUCING SAME, AND ELECTRONIC DEVICE

(71) Applicant: SHARP KABUSHIKI KAISHA, Sakai (JP)

(72) Inventors: Tomoko Teranishi, Sakai (JP); Hao Li, Sakai (JP); Shigeyasu Mori, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 806 days.

(21) Appl. No.: 16/070,578

(22) PCT Filed: Jan. 11, 2017

(86) PCT No.: PCT/JP2017/000558
§ 371 (c)(1),
(2) Date: Jul. 17, 2018

(87) PCT Pub. No.: WO2017/126374
PCT Pub. Date: Jul. 27, 2017

(65) Prior Publication Data
US 2021/0208386 A1    Jul. 8, 2021

(30) Foreign Application Priority Data
Jan. 18, 2016    (JP) .............................. JP2016-007457

(51) Int. Cl.
*G02B 26/00*    (2006.01)
*H01L 27/12*    (2006.01)

(52) U.S. Cl.
CPC ........ *G02B 26/005* (2013.01); *H01L 27/1248* (2013.01); *H01L 27/1259* (2013.01)

(58) Field of Classification Search
CPC . G02B 26/004; G02B 26/005; H01L 27/1248; H01L 27/1259; G01N 37/00; B01J 19/08
See application file for complete search history.

(56) References Cited

U.S. PATENT DOCUMENTS

| | | | |
|---|---|---|---|
| 2010/0053717 | A1 | 3/2010 | Takahashi |
| 2013/0062205 | A1 | 3/2013 | Hadwen et al. |
| 2015/0368413 | A1 | 12/2015 | Tatemichi et al. |
| 2016/0305906 | A1* | 10/2016 | Amos .............. G01N 27/44791 |

FOREIGN PATENT DOCUMENTS

| | | |
|---|---|---|
| CN | 102346298 A | 2/2012 |
| JP | 2008-170631 A | 7/2008 |
| JP | 2013-78758 A | 5/2013 |
| JP | 2014-156599 A | 8/2014 |
| JP | 2014-163948 A | 9/2014 |

* cited by examiner

*Primary Examiner* — Joseph P Martinez
(74) *Attorney, Agent, or Firm* — ScienBiziP, P.C.

(57) ABSTRACT

In an electrode substrate (10), a contact hole (19) provided in a first planarizing resin layer (13) is filled with a second planarizing resin layer (16). A TFT (20) is electrically connected to an electrode (14) via the contact hole (19). On the electrode (14), a water repellent layer (18) is provided via a dielectric layer (15) including the second planarizing resin layer (16) and an ion barrier layer (17).

8 Claims, 12 Drawing Sheets

ELECTRODE SUBSTRATE, METHOD FOR PRODUCING SAME, AND ELECTRONIC DEVICE

TECHNICAL FIELD

The present invention relates to an electrode substrate, a method of producing the electrode substrate, and an electronic device.

BACKGROUND ART

In the field of microfluidics, manipulation and accurate control are required on a fluid of a small scale (e.g., submicroliter). Under the circumstances, attention has been drawn to electrowetting in which a droplet is manipulated through application of an electric field.

The electrowetting refers to a phenomenon in which a contact angle of a droplet with respect to a surface of a dielectric layer is changed through application of an electric field to the droplet placed on the dielectric layer which has been subjected to a water-repellent treatment and which is provided on an electrode. This phenomenon is caused by changing, through the application of an electric field, surface energy of the dielectric layer by an amount of electrostatic energy of a capacitor formed between the electrode and the droplet, so that solid-liquid interface energy is changed.

Recent years have seen development of an electrowetting device (also referred to as a microfluid device or a droplet device) in which the electrowetting is utilized.

As such an electrowetting device, for example, Patent Literature 1 discloses an active matrix electrowetting-on-dielectric (AM-EWOD) device. In the AM-EWOD device, the electrowetting and dielectrophoresis are utilized to drive a droplet contained in an array element, i.e., to perform electrowetting-on-dielectric (EWOD).

In view of process and cost, such an electrowetting device employs, as disclosed in Patent Literature 1, a thin film transistor (TFT)-based electronic circuit for control of the array element.

CITATION LIST

Patent Literature

[Patent Literature 1]
Japanese Patent Application Publication Tokukai No. 2013-78758 (Publication date: May 2, 2013)

SUMMARY OF INVENTION

Technical Problem

However, TFTs constituting an active matrix require contact holes which cause an uneven structure.

FIG. 15 is a sectional view illustrating a problem of an electrode substrate 310 of a conventional electrowetting device. FIG. 16 is a perspective view illustrating the problem of the electrode substrate 310 of the conventional electrowetting device. Note that illustration of wires and the like is omitted in FIG. 16.

The electrode substrate 310 of the electrowetting device is typically configured such that a thin film electronic circuitry layer 312 including a plurality of TFTs 320, a planarizing resin layer 313, a plurality of electrodes 314 each serving as an EW driving element electrode, an ion barrier layer 317, and a water repellent layer 318 are stacked, on an insulating substrate 311 serving as a supporting substrate, in this order from a side of the insulating substrate 311 (see FIG. 15). Each electrode 314 is electrically connected to a corresponding TFT 320 via a contact hole 319 secured in the planarizing resin layer 313.

The ion barrier layer 317 is made of an inorganic material. The ion barrier layer 317 has unevenness caused by the contact hole 319.

Although there has conventionally been known an electrode substrate coated with a water repellant resin, a resin layer has a dielectric constant significantly lower than that of an inorganic layer. In order to address such a disadvantage, an electrode substrate 310 having a double layer structure has been used as a current mainstream of an electrode substrate for use in an electrowetting device. The double layer structure is made up of a water repellent layer 318 and an ion barrier layer 317, which is made of an inorganic material having a high dielectric constant.

However, in the electrode substrate 310 with such a configuration, a water repellant material may not be able to follow an uneven structure caused by a contact hole 319 in a case where, for example, dip coating is employed to form the water repellent layer 318 on the ion barrier layer 317. This causes cracks and floats in the water repellent layer 318 formed in the contact hole 319, and ultimately leads to the following problems (i) and (ii). Specifically, as illustrated in regions 315 and 331 outlined by respective dotted lines in FIG. 15, (i) the water repellent layer 318 may peel off or (ii) a water repellent agent may be accumulated on a bottom edge of the contact hole 319, and this accumulation may ultimately cause unevenness in thickness of the water repellent layer 318.

Liquid drops 401 and 411 placed on the electrode substrate 310 each move like sliding on the water repellent layer 318 (see FIG. 16). In so doing, movement of the droplets 401 and 411 may stop if the water repellent layer 318 has a local difference of elevation and/or a water repellency failure as illustrated in the regions 315 and 331 of FIG. 15. In view of the circumstances, a flat dense water repellent layer 318 is required to achieve a high water repellency required in an electrowetting device.

A flatness of a surface of the water repellent layer 318 depends on a flatness of a surface of a lower layer serving as a base of the water repellent layer 318. Therefore, electrowetting performance is greatly affected by unevenness of the base of the water repellent layer 318.

Since the water repellent layer 318 needs to have a flat surface, adhesion of the water repellent layer 318 with respect to the base cannot be improved by roughening a surface of the base of the water repellent layer 318. According to study made by the inventors of the present invention, in order to improve the adhesion of the water repellent layer 318 with respect to the base, it is conversely necessary to improve a flatness of the base. Unevenness of the base of the water repellent layer 318 may cause a deterioration in adhesion of the water repellent layer 318, and may ultimately cause the water repellent layer 318 to peel off.

A surface of the electrode substrate 310 becomes partially hydrophilic in a case where the water repellent layer 318 peels off. This causes a pinning effect that prevents the movement of the droplets 401 and 411.

As a result, droplets 401a and 401b, each of which is a part of the droplet 401, may locally stick to hydrophilic portions, and may remain on a flow path (see FIG. 16). This may cause the droplet 401 to become as small as a droplet 401c while moving. Moreover, a droplet 411a, which is a part of the droplet 411, sometimes locally sticks to a hydrophilic portion, and may get stuck on the hydrophilic portion. As such, the electrowetting performance is greatly affected by the unevenness of the base of the water repellent layer 318.

Therefore, a large contribution to development and practical utilization of, for example, an electrowetting device can be bought about by achieving an electrode substrate which includes a water repellent layer whose adhesion is higher than that of a conventional technique and which can prevent the water repellent layer from peeling off.

The present invention was attained in view of the above conventional problems, and an object of the present invention is to provide an electrode substrate which includes a water repellent layer whose adhesion is higher than that of a conventional technique and which can prevent the water repellent layer from peeling off, a method of producing the electrode substrate, and an electronic device.

Solution to Problem

In order to attain the above object, an electrode substrate in accordance with an aspect of the present invention includes: an insulating substrate; an active element provided on the insulating substrate; a first planarizing resin layer which covers the active element; an electrode connected to the active element, via a contact hole which is secured in the first planarizing resin layer; a dielectric layer which covers the electrode; and a water repellent layer which covers the dielectric layer, the dielectric layer including at least one second planarizing resin layer and at least one ion barrier layer which is made of an inorganic material, the contact hole being filled with the dielectric layer including the at least one second planarizing resin layer.

In order to attain the above object, an electronic device in accordance with an aspect of the present invention includes an electrode substrate in accordance with an aspect of the present invention.

In order to attain the above object, a method of producing an electrode substrate in accordance with an aspect of the present invention includes the steps of: (a) forming an active element on an insulating substrate; (b) forming a first planarizing resin layer which covers the active element; (c) forming, on the first planarizing resin layer, an electrode connected to the active element via a contact hole; (d) forming a dielectric layer which covers the electrode, the dielectric layer including at least one second planarizing resin layer and at least one ion barrier layer which is made of an inorganic material; and (e) forming a water repellent layer which covers the dielectric layer, in the step (d), the contact hole being filled with the dielectric layer which includes the at least one second planarizing resin layer.

Advantageous Effects of Invention

An aspect of the present invention makes it possible to provide an electrode substrate which includes a water repellent layer whose adhesion is higher than that of a conventional technique and which can prevent the water repellent layer from peeling off, a method of producing the electrode substrate, and an electronic device.

Figure 7:
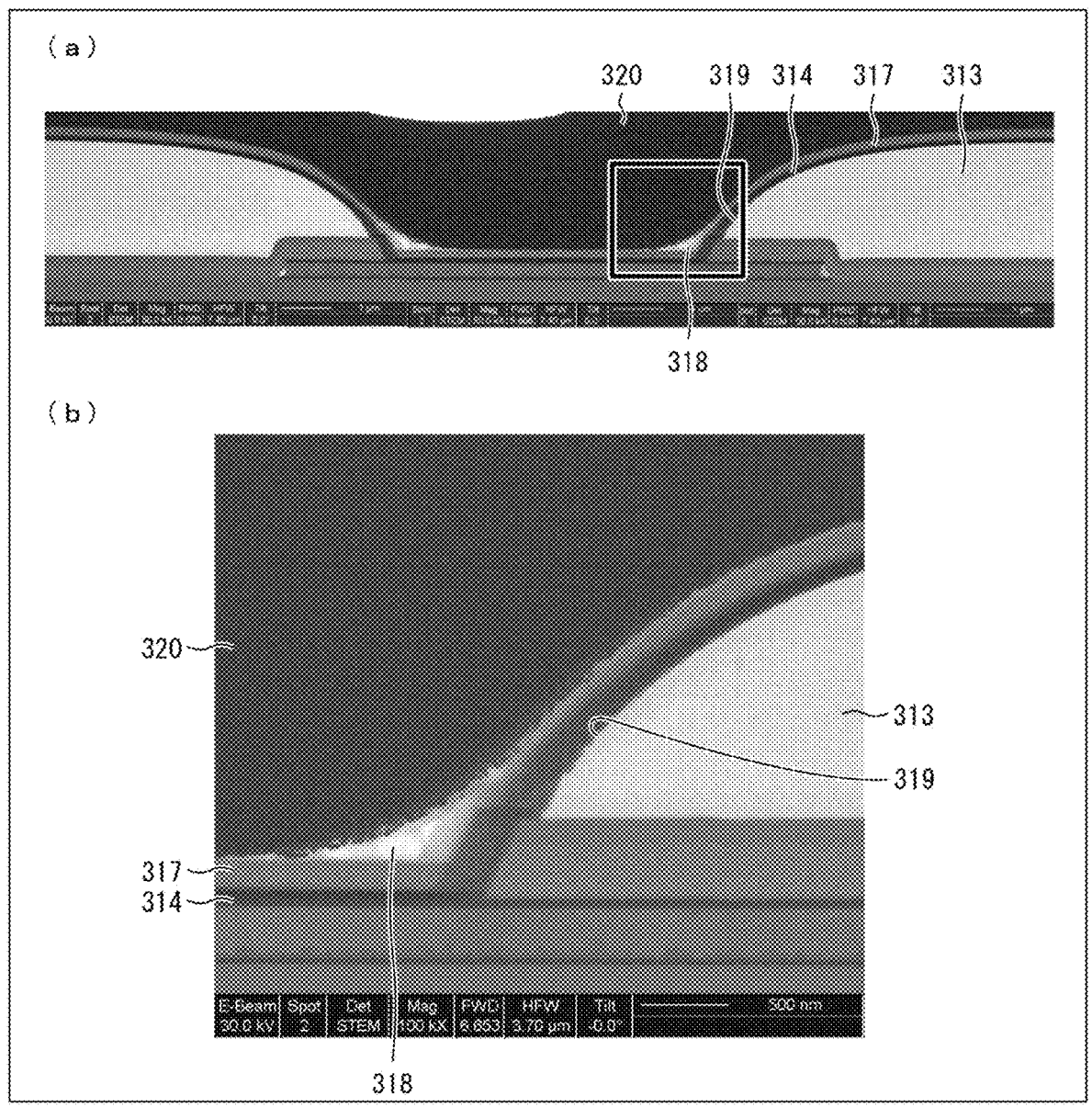

(a) and (b) of FIG. 7 are each a view showing an SEM photograph of a cross section of a main part of a comparative electrode substrate which was prepared without filling a contact hole with a second planarizing resin layer.

Figure 8:
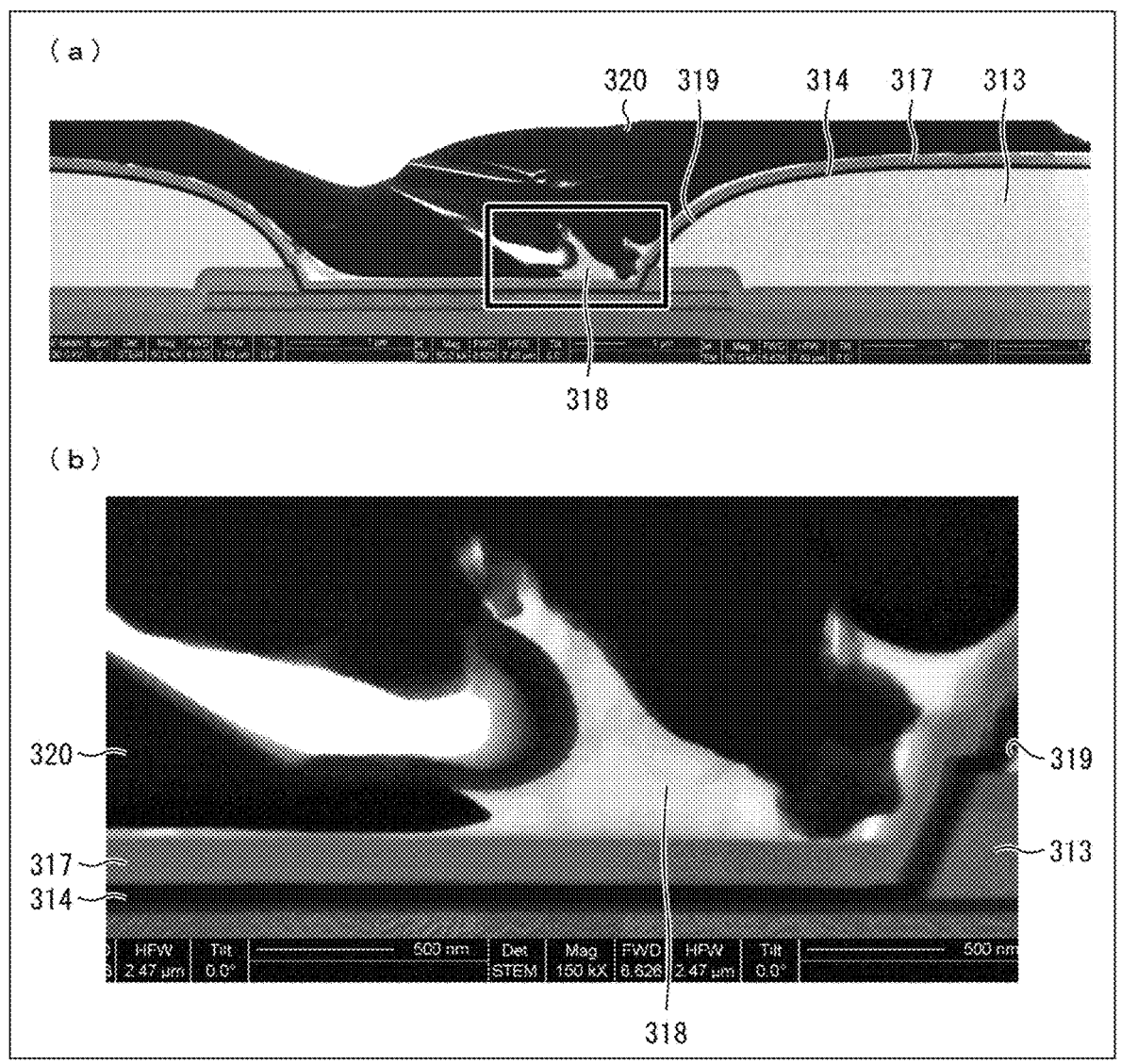

(a) and (b) of FIG. 8 are each another view showing an SEM photograph of a cross section of a main part of a comparative electrode substrate which was prepared without filling a contact hole with a second planarizing resin layer.

Figure 9:
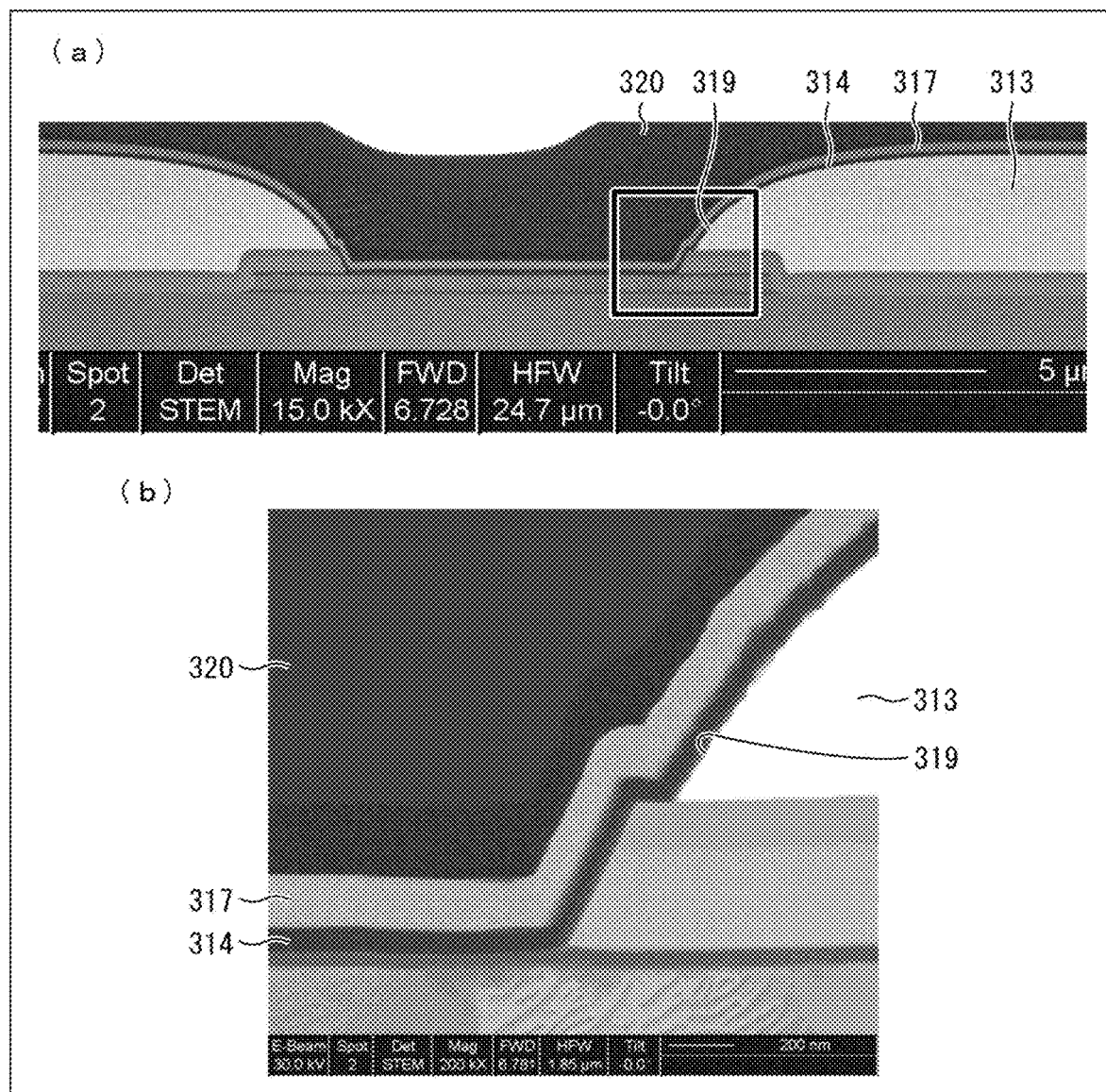

(a) and (b) of FIG. 9 are each still another view showing an SEM photograph of a cross section of a main part of a comparative electrode substrate which was prepared without filling a contact hole with a second planarizing resin layer.

Figure 10:
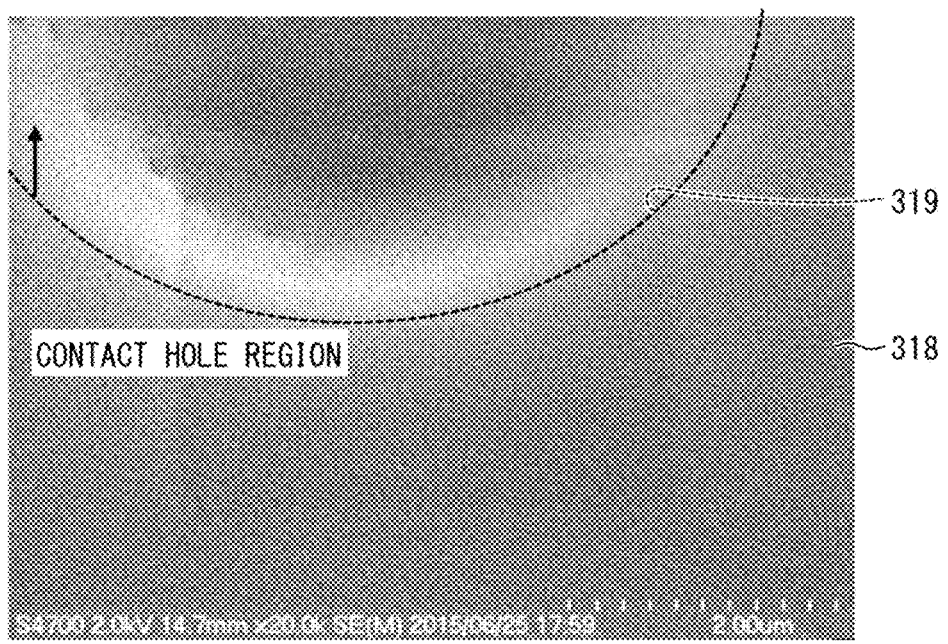

FIG. 10 is a view showing a SEM photograph of a water repellent layer of a comparative electrode substrate which was prepared without filling a contact hole with a second planarizing resin layer, the SEM photograph being taken from above the contact hole.

Figure 11:
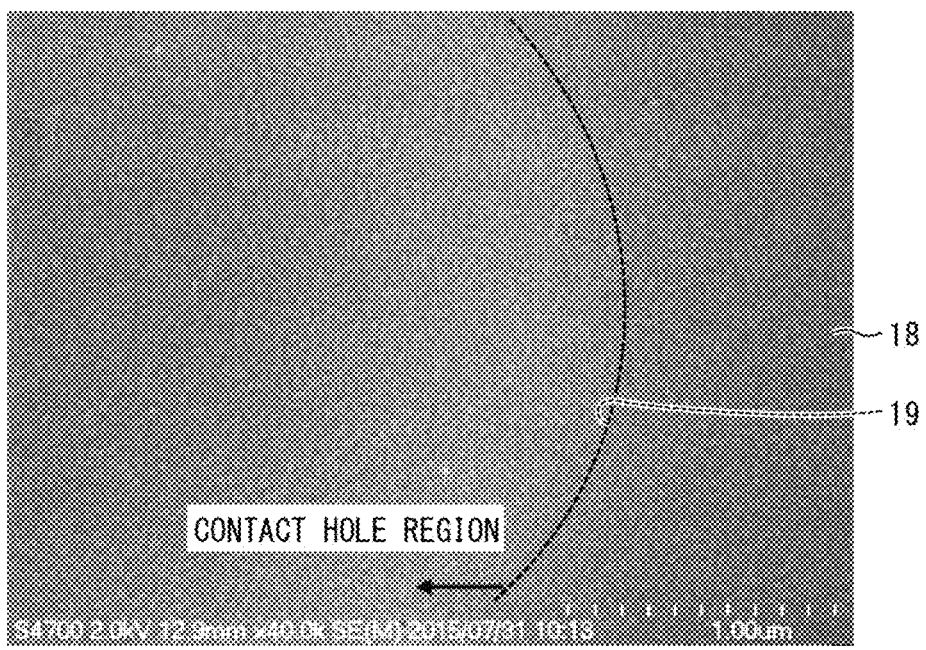

FIG. 11 is a view showing a SEM photograph of a water repellent layer of the electrode substrate in accordance with Embodiment 1 of the present invention, the SEM photograph being taken from above the contact hole.

Figure 12:
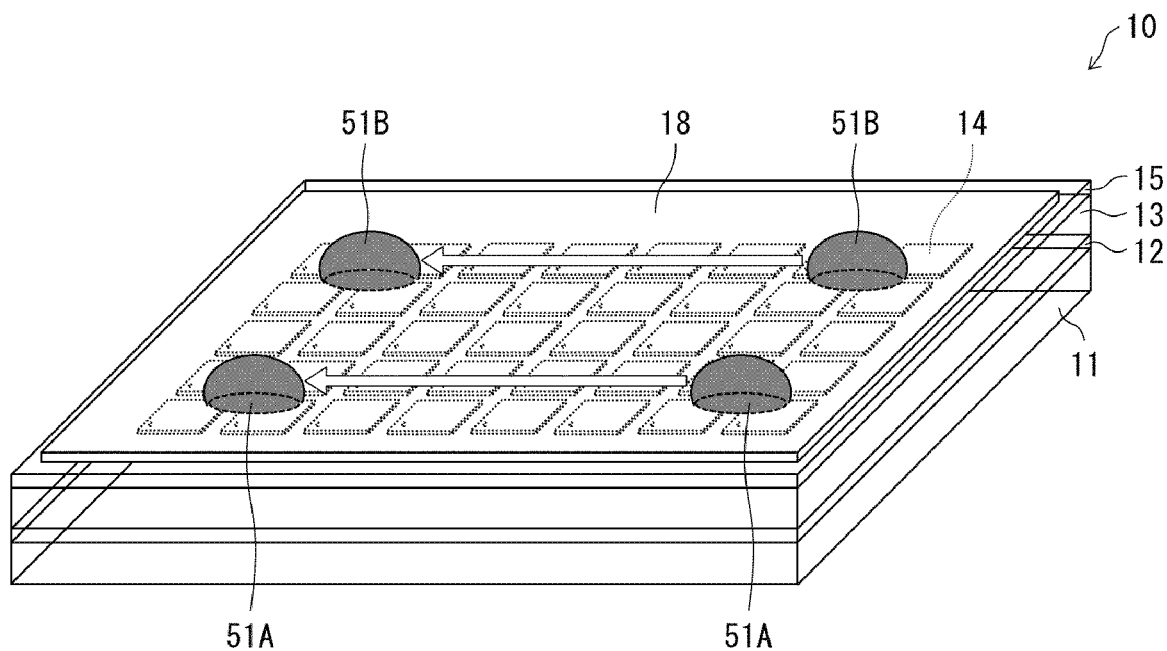

FIG. 12 is a perspective view illustrating how a droplet moves on the electrode substrate in accordance with Embodiment 1 of the present invention.

Figure 13:
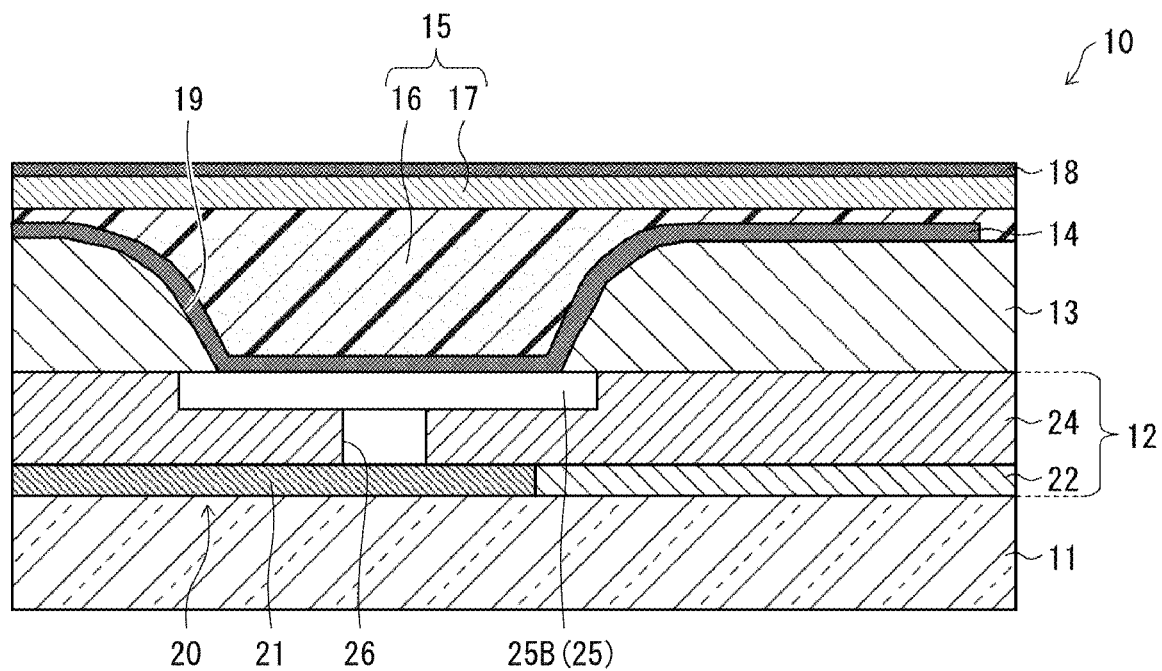

FIG. 13 is a sectional view schematically illustrating an example of a main configuration of an electrode substrate in accordance with Embodiment 2 of the present invention.

Figure 14:
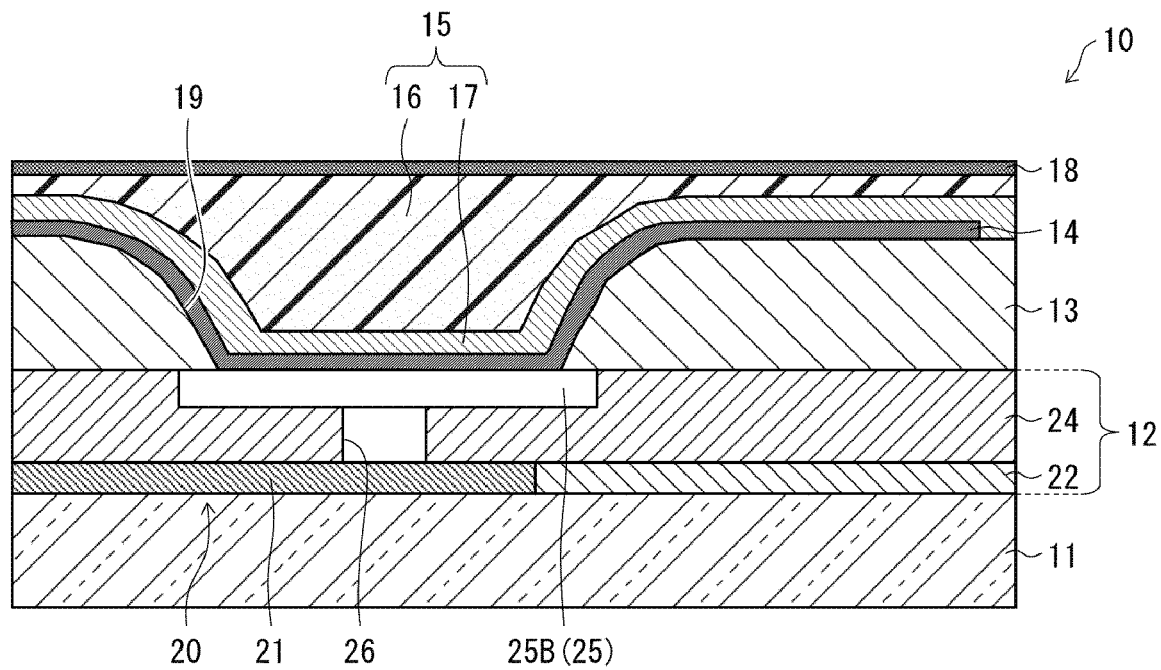

FIG. 14 is a sectional view schematically illustrating an example of a main configuration of an electrode substrate in accordance with Embodiment 3 of the present invention.

Figure 15:
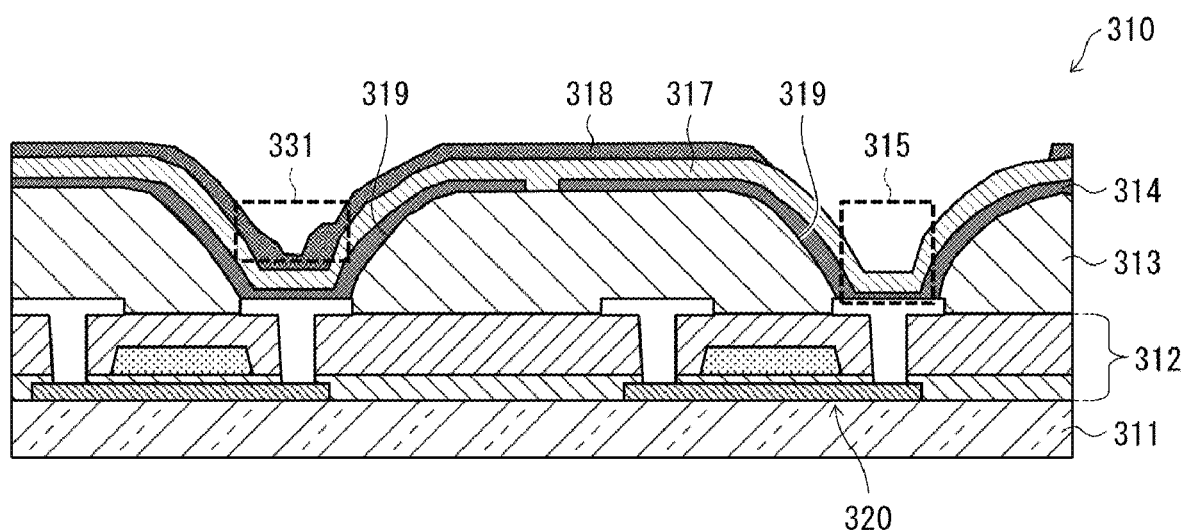

FIG. 15 is a sectional view illustrating a problem of an electrode substrate in accordance with a conventional electrowetting device.

Figure 16:
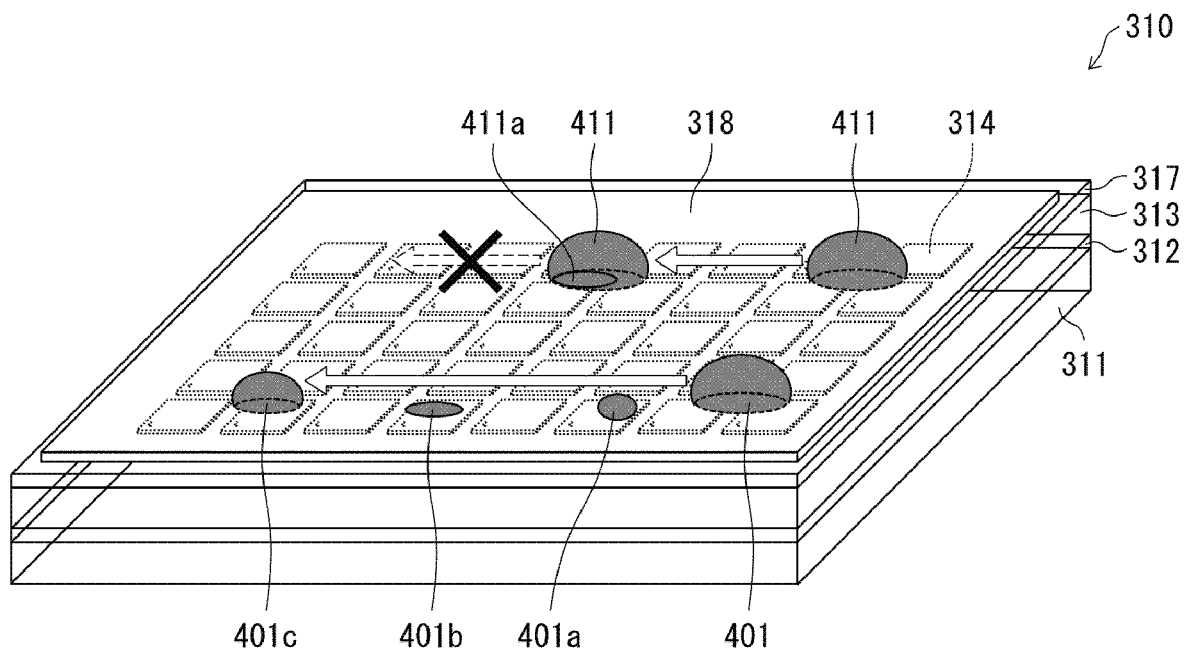

FIG. 16 is a perspective view illustrating the problem of the electrode substrate in accordance with the conventional electrowetting device.

DESCRIPTION OF EMBODIMENTS

The following description will discuss embodiments of the present invention in detail.

Embodiment 1

Embodiment 1 of the present invention will be discussed below with reference to FIGS. 1 through 12.

An electrode substrate in accordance with Embodiment 1 includes: (i) an active element provided on an insulating substrate, (ii) a first planarizing resin layer which covers the active element, (iii) an electrode connected to the active element via a contact hole which is secured in the first planarizing resin layer, (iv) a dielectric layer which covers the electrode, and (v) a water repellent layer which covers the dielectric layer. The dielectric layer includes at least one second planarizing resin layer and at least one ion barrier layer which is made of an inorganic material. The contact hole is filled with the dielectric layer which includes the at least one second planarizing resin layer.

The electrode substrate is an electrode substrate in which transistors, each serving as the active element, are provided on an insulating substrate. Examples of the electrode substrate include a TFT substrate which includes thin film transistors (TFTs, TFT elements) each serving as the active element.

The electrode substrate in accordance with Embodiment 1 has the following advantages (i) and (ii). Specifically, (i) the electrode substrate excels in flatness of a surface on which an electrode is provided and in resistance to leakage and (ii) the water repellent layer is hard to peel off. The electrode substrate can therefore be suitably utilized for electrowetting. In view of the circumstances, the following description will take an example where (i) the electrode substrate in accordance with Embodiment 1 is an electrowetting substrate in which a droplet is manipulated by electrowetting (EW) and (ii) an electrowetting driving element electrode, on which the droplet is manipulated, is employed as the electrode.

The electrowetting, as has been discussed, refers to a phenomenon in which a contact angle of a droplet with respect to a surface of a dielectric layer is changed through application of a voltage to the droplet placed on the dielectric layer which has been subjected to a water-repellent treatment (i.e., a hydrophobic treatment) and which is provided on an electrode. This phenomenon is caused by changing, through the application of a voltage, surface energy of the dielectric layer by an amount of electrostatic energy of a capacitor formed between the electrode and the droplet, so that solid-liquid interface energy is changed.

The electrode substrate can be employed, by itself, as an electrowetting device, if circumstances permits (e.g., for use in an analyzing device). Alternatively, the electrode substrate can be employed in combination with an opposite substrate for, for example, the purpose of preventing loss of a droplet due to evaporation or for use in an electrowetting display device or the like.

In view of the circumstances, the following description will take an example where the electrode substrate is employed in an active matrix electrowetting-on-dielectric (AM-EWOD) device in which a droplet is sealed in an internal space surrounded by the electrode substrate and the opposite substrate.

Figure 1:
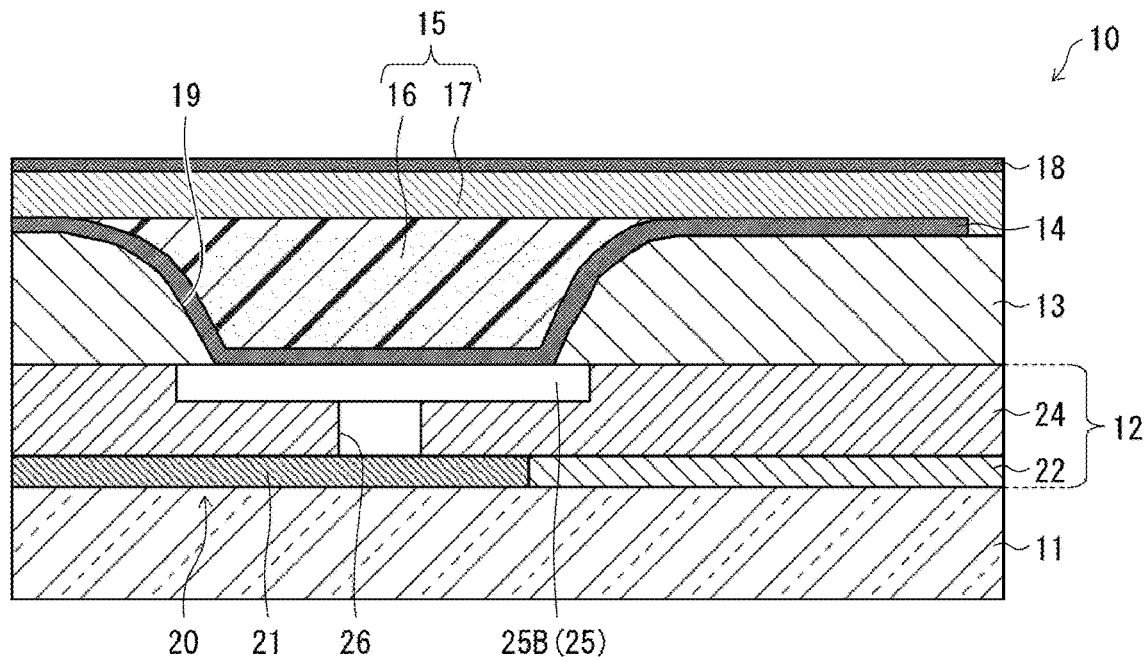
FIG. 1 is a sectional view schematically illustrating an example of a main configuration of an electrode substrate in accordance with Embodiment 1 of the present invention.
Figure 2:
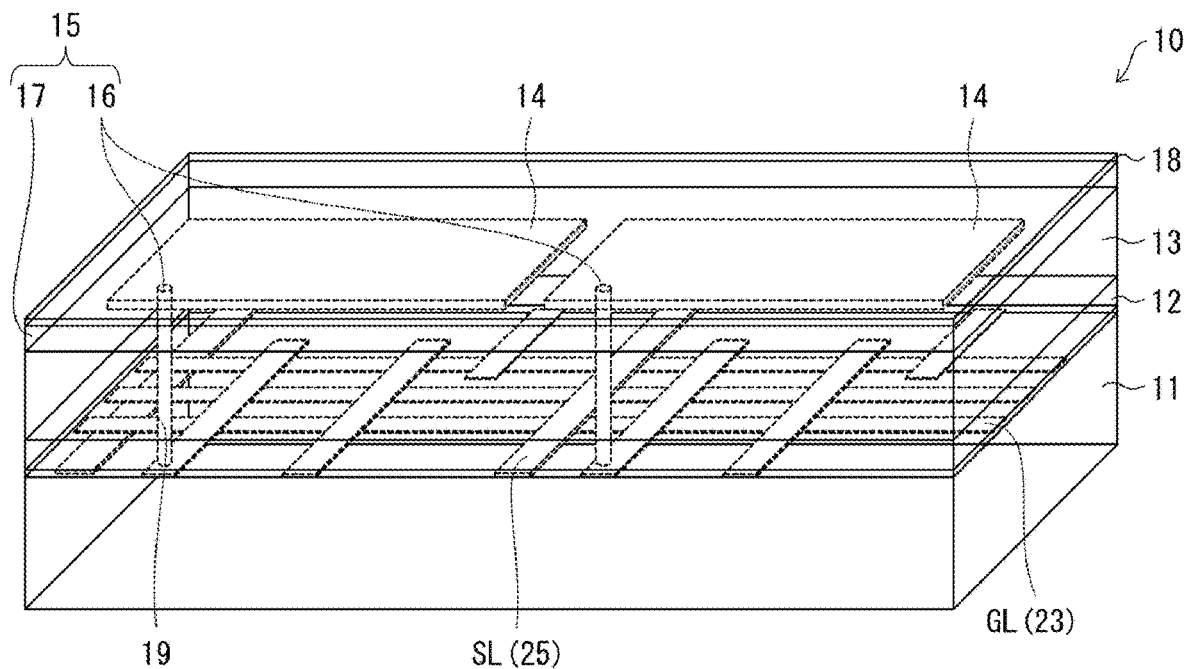
FIG. 2 is a perspective view schematically illustrating the main configuration of the electrode substrate in accordance with Embodiment 1 of the present invention.
Figure 3:
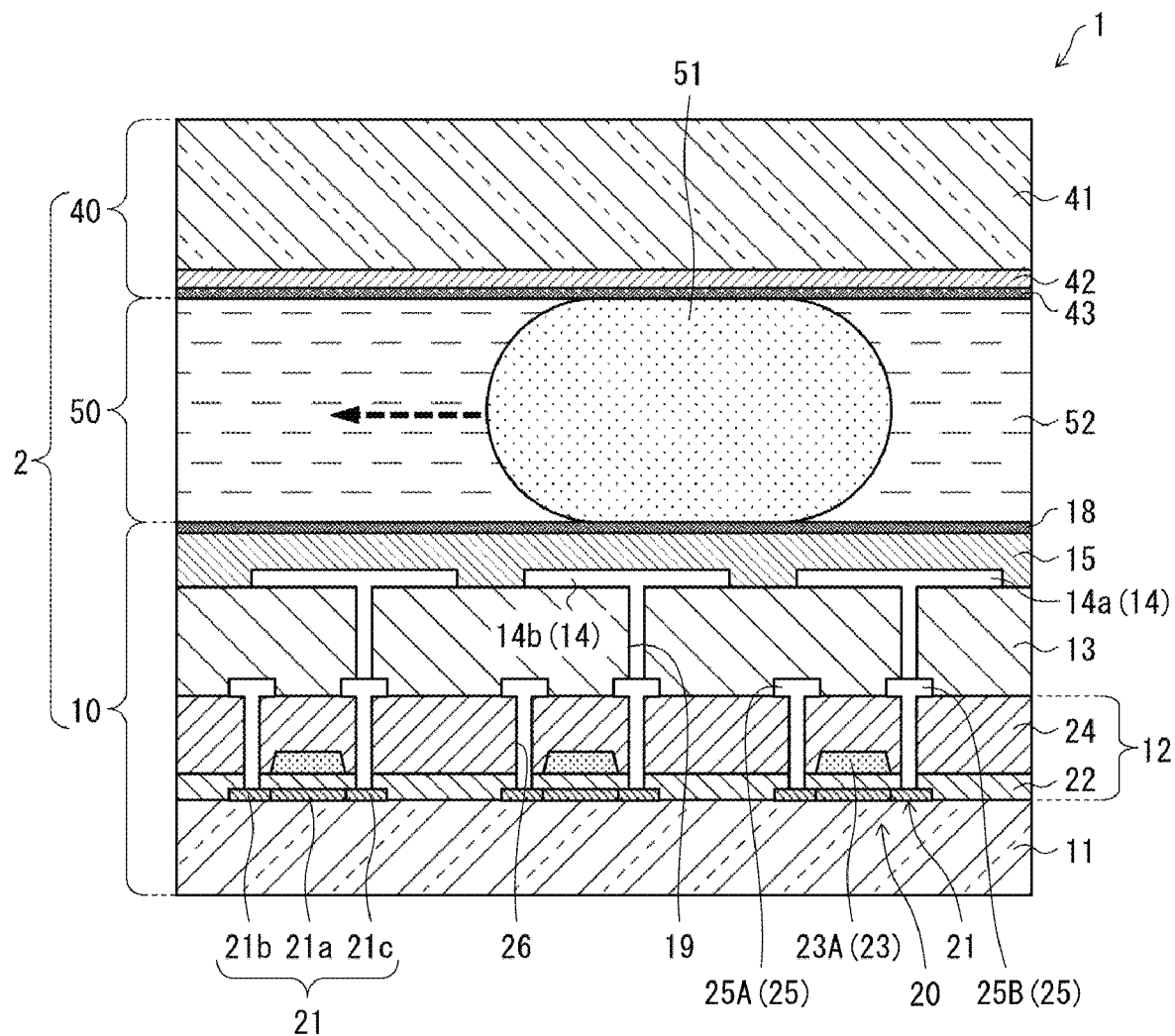
FIG. 3 is a sectional view schematically illustrating a configuration of an electrowetting device in accordance with Embodiment 1 of the present invention.
Figure 4:
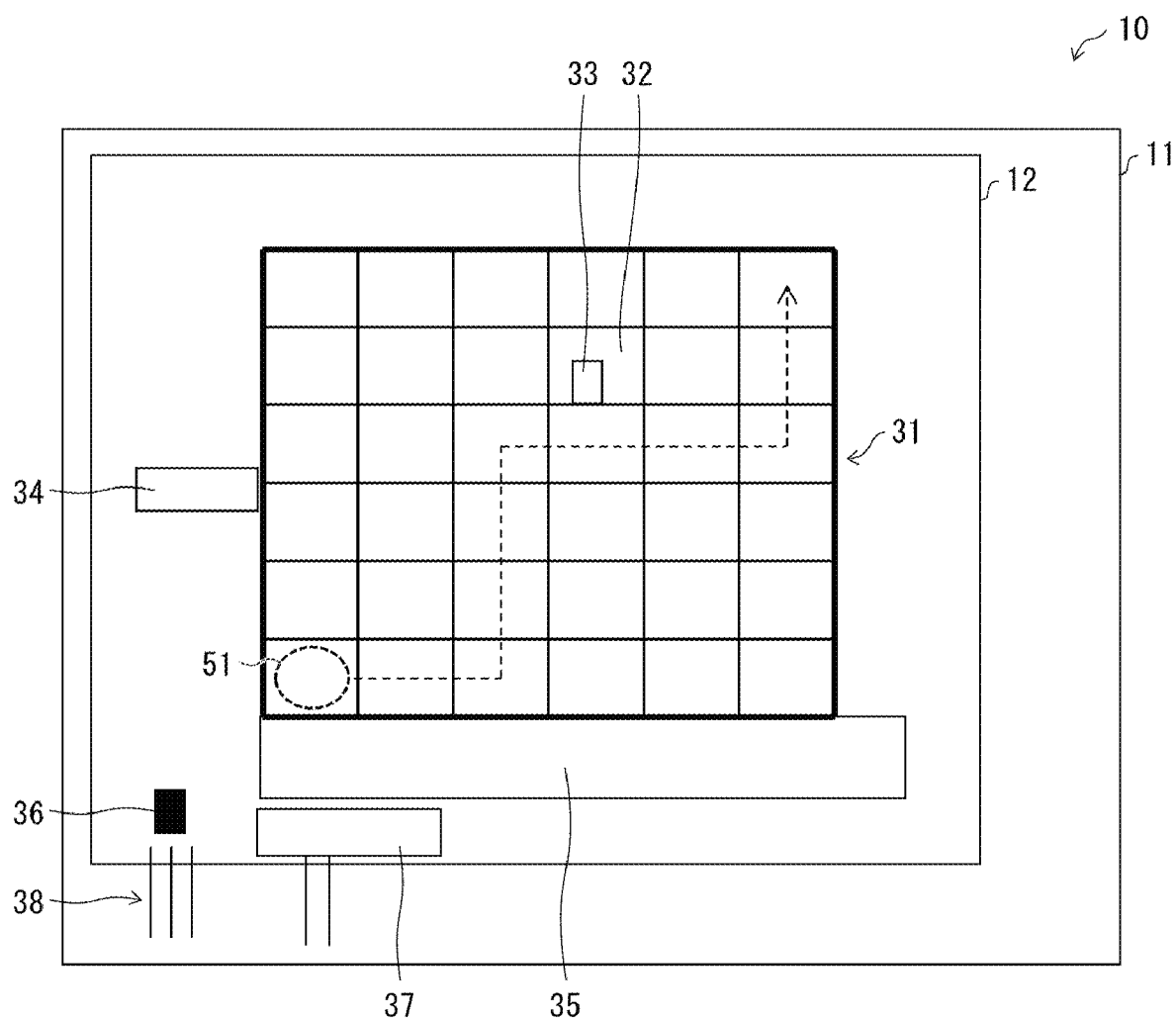
FIG. 4 is a plan view schematically illustrating an example of a configuration of a thin film electronic circuit for use in the electrowetting device in accordance with Embodiment 1 of the present invention.

FIG. 1 is a sectional view schematically illustrating an example of a main configuration of an electrode substrate 10 in accordance with Embodiment 1. FIG. 2 is a perspective view schematically illustrating the main configuration of the electrode substrate 10 in accordance with Embodiment 1. FIG. 3 is a sectional view schematically illustrating a configuration of an electrowetting device 1 in accordance with Embodiment 1. FIG. 4 is a plan view schematically illustrating an example of a configuration of a thin film electronic circuitry layer 12 for use in the electrowetting device 1 in accordance with Embodiment 1.

<Schematic Configuration of Electrowetting Device 1>

The electrowetting device 1 in accordance with Embodiment 1 includes a pair of substrates, i.e., the electrode substrate 10 in accordance with Embodiment 1 and an opposite substrate 40 provided so as to face the electrode substrate 10 (see FIGS. 3 and 4). The electrode substrate 10 and the opposite substrate 40 are provided so as to face each other via an internal space 50 (i.e., cell gap), which forms a micro flow path.

The electrode substrate 10 and the opposite substrate 40 are attached to each other with the use of a sealant (not illustrated) located at their respective peripheral edges. This causes a cell 2, in which the internal space 50 is secured, to be formed. Note that the internal space 50 can be secured, in a given void, by a spacer (not illustrated).

The electrowetting device 1 in accordance with Embodiment 1 is, as has been discussed, an active matrix electrowetting-on-dielectric (AM-EWOD) device, and includes an electrode array 31 (see FIG. 4). The electrode array 31 includes a plurality of array elements 32 configured to manipulate one or more droplets 51 placed on the electrode array 31.

The electrode array 31 includes M×N array elements 32 (see FIG. 4). Here, each of M and N can be a given numerical value. In a typical example, each of M and N is 2 or greater.

Each array element 32 includes (i) an electrode 14 (e.g., electrodes 14a and 14b) provided in the electrode substrate 10 and (ii) an electrode 42 provided in the opposite substrate 40 (see FIG. 3). Each array element 32 also includes an array element circuit 33 configured to control electrical potential of a corresponding electrode 14.

The one or more droplets 51 can be placed between the electrodes 14 and 42, i.e., within the cell 2. The array element circuit 33 is configured to supply a driving signal to each of the electrodes 14 and 42 in the plurality of array elements 32 so as to manipulate the one or more droplets 51 between the plurality of array elements 32.

The following description will more specifically discuss the above configuration.

(Opposite Substrate 40)

The opposite substrate 40 is configured so that a surface of the insulating substrate 41, on which surface the electrode 42 is provided, is opposed to the electrode substrate 10 (see FIG. 3). The insulating substrate 41 serves as a supporting substrate. The electrode 42 serves as an opposite electrode.

The electrode 42 is, for example, provided in a solid manner on the insulating substrate 41. Typically, the electrode 42 is shared by all the plurality of array elements 32. Each electrode 42 can alternatively be provided for a corresponding array element 32. Each electrode 42 can alternatively be provided for a corresponding group of a plurality of array elements 32.

The electrode 42 is covered with a water repellent layer 43. The solid water repellent layer 43 is provided entirely on a surface of the opposite substrate 40, which surface faces the electrode substrate 10.

(Electrode Substrate 10)

The electrode substrate 10 illustrated in FIG. 1 is an active matrix TFT substrate (active matrix substrate, TFT array substrate), which includes (i) a plurality of gate wires GL, (ii) a plurality of source wires SL, and (iii) a plurality of TFTs 20 connected to the respective plurality of gate wires GL and the respective plurality of source wires SL (see FIGS. 2 and 3). Each of the plurality of TFTs 20 is an active element (i.e., switching element, semiconductor element), and is provided at an intersection between the respective plurality of gate wires GL and the respective plurality of source wires SL.

The electrode substrate 10 is used as an active matrix electrowetting-on-dielectric (AM-EWOD) substrate which carries out a droplet drive (i.e., which carries out EWOD) in an active matrix array.

An AM-EWOD substrate, through use of an electronic circuit including TFTs, has an advantage that a driving circuit can be integrated on an AM-EWOD substrate. Moreover, such a TFT-based electronic circuit is suitable for AM-EWOD.

An electrode substrate 10 in accordance with Embodiment 1 is configured such that (i) a thin film electronic circuitry layer 12 including a plurality of TFTs 20, (ii) a first planarizing resin layer 13, (iii) a plurality of electrodes 14 (EW driving element electrodes), (iv) a dielectric layer 15 composed of a second planarizing resin layer 16 and an ion barrier layer 17, and (v) a water repellent layer 18 are stacked, on an insulating substrate 11 (supporting substrate), in this order from a side of the insulating substrate 11 (see FIGS. 1 through 3).

Note that FIGS. 1 through 3 each illustrate an example configuration where a water repellent layer 18 is merely provided on a surface (i.e., active surface) of an insulating substrate 11 on which surface a plurality of electrodes 14 are provided. However, the electrode substrate 10 in accordance with Embodiment 1 is not limited as such. Alternatively, all surfaces of the electrode substrate 10 can be covered with a water repellent layer 18.

The thin film electronic circuitry layer 12 is a circuitry layer including a plurality of TFTs 20 (see FIGS. 1 and 3) so as to drive each electrode 14.

A plurality of gate wires GL and a plurality of source wires SL are provided so as to intersect with each other on the insulating substrate 11. For example, a TFT 20 is provided in the vicinity of an intersection between the respective plurality of gate wires GL and the respective plurality of source wires SL.

Each TFT 20 includes, for example, (i) a semiconductor layer 21 provided on the insulating substrate 11, (ii) a gate insulating film 22 which covers the semiconductor layer 21, (iii) a gate electrode 23A provided on the gate insulating film 22, (iv) an interlayer insulating film 24 provided so as to cover the gate electrode 23A, and (v) a source electrode 25A and a drain electrode 25B each connected to the semiconductor layer 21 via the interlayer insulating film 24 (see FIGS. 1 and 3).

In the semiconductor layer 21, a first region, which faces the gate electrode 23A via the gate insulating film 22, serves as a channel region 21a. In the semiconductor layer 21, second and third regions, which are other than the first channel region and are each an $n^+$ layer to which an impurity is heavily added, serve as a source region 21b and a drain region 21c, respectively. Although not illustrated in the drawings, an LDD (Light Doped Drain) region, to which an impurity is lightly added, is provided on each channel region side of the source region 21b and the drain region 21c. This causes an electrical property to be prevented from deteriorating due to a hot carrier.

Each TFT 20, illustrated in FIG. 3, is a top-gate (staggered) TFT in which a gate electrode 23A is provided above a channel region 21a of a semiconductor layer 21, via the gate insulating film 22. The channel region 21a is located between (i) the source region 21b connected to the source electrode 25A and (ii) the drain region 21c connected to the drain electrode 25B.

Alternatively, each TFT 20 can be a bottom-gate (inversely staggered) TFT, which is configured such that (i) a gate electrode 23A, (ii) a gate insulating film 22, (iii) a channel layer (semiconductor layer) and an $n^+$ layer(semiconductor layer), and (iv) a source electrode 25A and a drain electrode 25B are stacked in this order.

The thin film electronic circuitry layer 12 includes the plurality of TFTs 20, the gate insulating film 22, and the interlayer insulating film 24. The gate insulating film 22 and the interlayer insulating film 24 constitute a part of the plurality of TFTs 20.

As has been discussed, a plurality of semiconductor layers 21 are specifically provided on the insulating substrate 11 in an island-like manner. The plurality of semiconductor layers 21 are covered with the solid gate insulating film 22 provided on an entire surface of the insulating substrate 11.

There is provided, on the gate insulating film 22, a first metal wire layer 23 which includes (i) a gate electrode 23A (see FIG. 3) and (ii) a plurality of gate wires GL (see FIG. 2). The first metal wire layer 23 is covered with a solid interlayer insulating film 24 which is provided on an entire surface of the gate insulating film 22.

There are provided, on the interlayer insulating film 24, a second metal wire layer 25 which includes (i) a source electrode 25A and a drain electrode 25B (see FIG. 3) and (ii) a plurality of source wires SL (see FIG. 2).

Each source electrode 25A is electrically connected to the source region 21b of a corresponding semiconductor layer 21 via a corresponding contact hole 26, which passes through the interlayer insulating film 24 and the gate insulating film 22.

Similarly, each drain electrode 25B is electrically connected to the drain region 21c of a corresponding semiconductor layer 21 via a corresponding contact hole 26, which passes through the interlayer insulating film 24 and the gate insulating film 22.

Note that the thin film electronic circuitry layer 12 further includes a row driving circuit 34 and a column driving circuit 35 (see FIG. 4). The row driving circuit 34 and the column driving circuit 35 each configured to supply a control signal to an array element circuit 33.

The thin film electronic circuitry layer 12 can also include a serial interface 36 which (i) processes a data stream of a serial input and (ii) writes a necessary voltage into the electrode array 31. The thin film electronic circuitry layer 12 can further include a voltage supplying interface 37 which supplies (i) a corresponding supply voltage, (ii) a voltage for driving the opposite substrate 40, and (iii) other necessary voltages. By configuring the thin film electronic circuitry layer 12 to include the serial interface 36 and the voltage supplying interface 37, it is possible to comparatively reduce, for example, (i) the number of connection wires 38 between the electrode substrate 10 and an external driving electronic circuit (not illustrated) and (ii) the number of power sources, even in a case where the electrode array 31 has a large size.

The array element circuit 33 can further have a sensor function. Specifically, the array element circuit 33 can further include a mechanism for (i) detecting presence of a droplet 51 at each position of the plurality of array elements 32 in the electrode array 31 and (ii) detecting a size of the droplet 51.

To this end, the thin film electronic circuitry layer 12 can further include a column detection circuit (not illustrated) for (i) reading out pieces of sensor data from the respective plurality of array elements 32 and (ii) putting together the pieces of sensor data into one or more serial output signals. The one or more serial output signals can be given via the serial interface 36, and can be outputted from the electrowetting device 1 via one or more of the connection wires 38.

The array element circuit 33 can be configured to apply a given droplet driving voltage to the droplet 51. The array element circuit 33 can include a memory element (not illustrated), an inverting circuit (not illustrated), and the like. The memory element can include, for example, (i) a column write line which extends from the column driving circuit 35, (ii) a row select line which extends from the row driving circuit 34, (iii) a capacitive storage device, (iv) a direct current (DC) supply voltage, and (v) a switch transistor. The column write line can be shared by array elements arranged in the same column. The row select line can be shared by array elements arranged in the same row.

The first planarizing resin layer 13 is provided on the thin film electronic circuitry layer 12 so as to cover the plurality of TFTs 20, the second metal wire layer 25, and the like (see FIGS. 1 through 3). The first planarizing resin layer 13 planarizes unevenness of a surface of the thin film electronic circuitry layer 12. The first planarizing resin layer 13 has a plurality of contact holes 19 via which the plurality of electrodes 14 are connected to drain electrodes 25B of the respective plurality of TFTs 20.

The plurality of electrodes 14 are provided on the first planarizing resin layer 13 in a matrix. Each of the plurality of electrodes 14 is an active matrix (AM) electrode (array element electrode), and constitutes a part of the electrode array 31 (see FIG. 4). The plurality of electrodes 14 are electrically connected to drain electrodes 25B of the TFTs 20, via the respective plurality of contact holes 19 (see FIGS. 1 through 3).

The plurality of electrodes 14, which are connected to the thin film electronic circuitry layer 12 via the respective plurality of TFTs 20, can be construed as a part of a layer constituting the thin film electronic circuitry layer 12. This kind of configuration is referred to as an electrowetting driver element.

Note that an electrowetting driver element can be (i) an electrode 14 associated with a specific array element 32 or (ii) a node of an electronic circuit directly connected to the electrode 14. Note also that both (i) such an electrode 14 associated with a specific array element 32 and (ii) a node of an electronic circuit directly connected to the electrode 14 are sometimes collectively referred to as an electrowetting driver element.

The dielectric layer 15 is provided on the first planarizing resin layer 13 so as to cover the plurality of electrodes 14. The dielectric layer 15 is composed of the second planarizing resin layer 16 and the ion barrier layer 17, which is made of an inorganic film. The dielectric layer 15 separates the plurality of electrodes 14 from the water repellent layer 18. The water repellent layer 18 is provided on a surface of the electrode substrate 10 which surface faces the opposite substrate 40.

The plurality of contact holes 19 are each filled with the second planarizing resin layer 16 (see FIG. 1). In Embodiment 1, the second planarizing resin layer 16 is merely provided inside the plurality of contact holes 19, and no second planarizing resin layer 16 is therefore provided on an area, other than the plurality of contact holes 19, of the plurality of electrodes 14. That is, only the second planarizing resin layer 16 is provided, as the dielectric layer 15, inside the plurality of contact holes 19. In contrast, only the ion barrier layer 17 is provided as the dielectric layer 15 on an area, other than the plurality of contact holes 19, of the plurality of electrodes 14.

The plurality of contact holes 19 are each filled with the second planarizing resin layer 16. This causes the first planarizing resin layer 13, having the plurality of contact holes 19, to have a planarized surface. This ultimately causes the electrode substrate 10 to have an entire planarized surface.

In Embodiment 1, the second planarizing resin layer 16 is provided such that its surface is coplanar with the surfaces of the respective plurality of electrodes 14 outside the plurality of contact holes 19.

The ion barrier layer 17 is provided for preventing ions from permeating into the droplet 51. The ion barrier layer 17 is provided on the first planarizing resin layer 13, the plurality of electrodes 14, and the second planarizing resin layer 16 so as to cover them.

The water repellent layer 18, having a uniform thickness, is provided on the ion barrier layer 17 having a flat surface so as to cover an entire surface of the electrode substrate 10 which entire surface faces the opposite substrate 40.

(Internal Space 50)

The internal space 50 is secured in a void between the electrode substrate 10 and the opposite substrate 40. The internal space 50 is surrounded by the electrode substrate 10, the opposite substrate 40, and a sealant (not illustrated).

A droplet 51, which is an ionic liquid, is confined within the internal space 50. A space, other than the droplet 51, in the internal space 50 can be filled with a non-ionic liquid 52, which does not mix with the droplet 51.

The droplet 51 is provided such that, when a surface of the water repellent layer 18 is in contact with the droplet 51 and a gas (or the non-ionic liquid 52), a contact angle θ is formed, between a liquid surface of the droplet 51 and the surface of the water repellent layer 18, at a borderline of those three phases.

According to the Young's theory, the contact angle θ is found by the following Equation (1) based on equilibria between components of surface tensions of respective interfaces $$\cos\theta = (\gamma SG - \gamma SL)/\gamma LG \qquad (1)$$

where γSL denotes a surface tension (i.e., interface energy) exerted between the water repellent layer 18 and the droplet 51, γLG denotes a surface tension exerted between the droplet 51 and the gas (e.g., air), and γSG denotes a surface tension exerted between the water repellent layer 18 and the gas.

Note that Equation (1) can be replaced with the following Equation (2), in a case where the space of the internal space 50 which space is not occupied by the droplet 51 is filled with the non-ionic liquid 52 such as oil:

$$\cos\theta = (\gamma SO - \gamma SL)/\gamma LO \qquad (2)$$

where γLO denotes a surface tension exerted between the droplet 51 and the non-ionic liquid 52 (e.g., oil) and γSO denotes a surface tension exerted between the water repellent layer 18 and the non-ionic liquid 52.

The contact angle θ formed between the drop 51 and the water repellent layer 18 is changed by applying an electric field to the droplet 51, because of the following reason. Specifically, in a case where an electric field is applied to the droplet 51, surface energy of the dielectric layer 15 is changed by an amount of electrostatic energy of a capacitor which is formed between an electrode 14 and the droplet 51. This causes a change in surface tension (i.e., interface energy) exerted between the water repellent layer 18 and the droplet 51.

The electrowetting device 1 in accordance with Embodiment 1 can be driven by use of a method similar to a conventional method. As such, a method of driving the electrowetting device 1 is not described in Embodiment 1.

Electrical force is caused in a case where, during driving the electrowetting device 1, electrowetting driving voltages are applied across respective different electrodes (e.g., the electrodes 14*a* and 14*b*), electrical force is exerted on a corresponding one of the electrodes. This allows water repellency of each of the water repellent layers 18 and 43 to be effectively controlled. Therefore, for example, in a case where different electrodes (e.g., the electrodes 14*a* and 14*b*) are arranged such that respective different electrowetting driving voltages are applied thereacross, it is possible to move, in the internal space 50, the droplet 51 along surfaces of the respective water repellent layers 18 and 43.

<Method of Producing Electrowetting Device 1>

A method of producing the electrowetting device 1 will be discussed below.

The following description will first discuss (i) examples of materials for constituent elements of the electrowetting device 1 and (ii) examples of methods of forming such constituent elements.

A transparent insulating substrate is employed as each of the insulating substrates 11 and 41. For example, a glass substrate is employed as each of the insulating substrates 11 and 41. Embodiment 1, however, is not limited as such. Alternatively, a plastic substrate or a ceramic substrate can be employed as each of the insulating substrates 11 and 41.

A well-known TFT can be employed as the TFT 20. FIG. 3 illustrates, as has been discussed, an example of the TFT 20 of top-gate type (stagger type). A configuration of the TFT 20 is not limited to a particular configuration.

The TFT 20 can be formed by a well-known method with use of a well-known material. A continuous grain silicon (CGS) is employed as a semiconductor layer of the TFT 20, but the semiconductor layer is not limited as such. Employed as the TFT 20 is, for example, a TFT including a semiconductor layer 21 formed of: a polycrystalline silicon (i.e., polysilicon); a non-crystalline silicon (i.e., amorphous silicon); a microcrystalline silicon; zinc oxide; an oxide semiconductor material such as an oxidized substance (InGaZnOx) containing at least one element selected from indium (In), gallium (Ga), and zinc (Zn); an inorganic semiconductor material such as cadmium selenide; or an organic semiconductor material such as a polythiophene derivative, thiophene oligomer, a poly(p-phenylene vinylene) derivative, naphthacene, or pentacene.

The semiconductor layer 21 can be formed by a well-known method. Examples of the well-known method include the following (1) through (6): (1) a method in which an impurity is added by ion doping to an amorphous silicon formed into a film by a plasma-enhanced chemical vapor deposition (CVD) method; (2) a method in which an amorphous silicon is formed by a low pressure chemical vapor deposition (LPCVD) method in which a silane ($SiH_4$) gas is used, the amorphous silicon thus formed is crystalized by a solid phase growth method so as to obtain a polysilicon, and then ions are added to the polysilicon thus obtained by an ion implantation method; (3) a method in which an amorphous silicon is formed by an LPCVD method in which a $Si_2H_6$ gas is used or a PECVD method in which a $SiH_4$ gas is used, the amorphous silicon thus formed is annealed by a laser such as an excimer laser, the amorphous silicon thus annealed is crystalized so as to obtain a polysilicon, and then ions are added to the polysilicon thus obtained (i.e., low temperature process); (4) a method in which a polysilicon layer is formed by an LPCVD method or a PECVD method, the polysilicon layer thus formed is thermally oxidized at a temperature equal to or higher than 1000° C. so as to obtain a gate insulating film, a gate electrode made of an n$^+$ polysilicon is formed on the gate insulating film thus formed, and then ions are added to the gate insulating film and the gate electrode thus formed (i.e., high temperature process); (5) a method in which an organic semiconductor material is formed by an inkjet method or the like; and (6) a method in which a single crystal film is obtained from an organic semiconductor material.

The gate insulating film 22 can be made of, for example, silicon nitride (SiNx), spin-on glass (SOG), or $SiO_2$. The gate insulating film 22 can be formed by a well-known method. Examples of the well-known method include a PECVD method, an LPCVD method, and an application method such as a spin coating method. Note that the gate insulating film 22 can be, for example, $SiO_2$ obtained by thermally oxidizing a polysilicon film.

The first metal wire layer 23 and the second metal wire layer 25 are each made of a well-known material for electrodes and metal wires. Examples of the well-known material include: a single electrically conductive film made of a metal such as titanium (Ti), chromium (Cr), aluminum (Al), molybdenum (Mo), tantalum (Ta), tungsten (W), copper (Cu), or an alloy of such metals; and a stack of such electrically conductive films.

The first metal wire layer 23 and the second metal wire layer 25 each can be formed by a well-known method. For example, the first metal wire layer 23 and the second metal wire layer 25 each can be formed by forming the electrically conductive film (i.e., wire metal) and then patterning the electrically conductive film thus formed. The electrically conductive film can be formed by a well-known method. Examples of the well-known method include a sputtering method, a vacuum vapor deposition method, and a PECVD method. Further, the electrically conductive film can be patterned by a well-known patterning method such as photolithography.

The interlayer insulating film 24 can be made of a well-known insulating material for interlayer insulating films. Examples of the well-known insulating material include: an inorganic material such as oxide silicon ($SiO_2$), silicon nitride (SiN or $Si_2N_4$), and tantalum oxide (TaO or $Ta_2O_5$); and an organic material such as an acrylic resin and a resist material. Examples of the resist material include a photosensitive resin material such as a photosensitive acrylate material.

The interlayer insulating film 24 can be formed by a well-known method. Examples of the well-known method include: a dry process such as a chemical vapor deposition (CVD) method and a vacuum vapor deposition method; and a wet process such as a spin coating method. Further, apertures, which serve as the respective plurality of contact holes 26, can be formed by forming the interlayer insulating film 24 and then patterning the interlayer insulating film 24 by photolithography or the like.

The electrodes 14 and 42 are each preferably made of a transparent electrode material such as, for example, indium tin oxide (ITO) and indium zinc oxide (IZO). The electrodes 14 and 42 can be made of the same electrode material or respective different electrode materials.

A transparent electrically conductive film, which is made of the transparent electrode material as has been discussed and which serves as the electrode 14 or 42, can be stacked by various well-known methods. Examples of the well-known methods include a sputtering method, a vacuum vapor deposition method, and a plasma CVD method. The transparent electrically conductive film can be patterned by a well-known patterning method such as photolithography.

Examples of a material for each of the first planarizing resin layer 13 and the second planarizing resin layer 16 include a resin such as a polyimide, an acrylic resin, and a resist material. Examples of the resist material include a photosensitive resin material such as a photosensitive acrylate material.

The first planarizing resin layer 13 and the second planarizing resin layer 16 each have a thickness of, for example, several micrometers. Examples of a method of forming the first planarizing resin layer 13 and the second planarizing resin layer 16 include a spin coating method, and a slit coating method.

The plurality of contact holes 19 can be formed by forming the first planarizing resin layer 13 and then patterning the first planarizing resin layer 13 with the use of photolithography or the like.

The second planarizing resin layer 16 can be formed in an island-like manner by forming the second planarizing resin layer 1 and then patterning the second planarizing resin layer 16 with the use of photolithography or the like. In Embodiment 1, the second planarizing resin layer 16 is formed such that the second planarizing resin layer 16 is merely filled in the plurality of contact holes 19. It is therefore desirable to severely control a photolithography condition.

Examples of a material for the ion barrier layer 17 include an inorganic material such as oxide silicon, silicon nitride, and tantalum oxide.

The ion barrier layer 17 is formed so as to have a thickness of, for example, several hundreds of nanometers. The ion barrier layer 17 can be formed by a well-known method. Examples of the well-known method include a CVD method, and a vacuum vapor deposition method.

Examples of a material for the water repellent layer 18 include a fluorine-based water repellent agent such as a perfluoro amorphous resin. Examples of the water repellent agent include "CYTOP (registered trademark)—CTL107MK" and "CYTOP (registered trademark)—CTL809A", each of which is manufactured by AGC Asahi Glass Co., Ltd.

The water repellent layer 18 can be formed by a well-known method. Examples of the well-known method include a dip coating method, a spin coating method, and a slit coating method.

Employed as the droplet 51 is a liquid such as water, an electrolyte solution (i.e., solution of electrolyte), alcohols, or various ionic liquids. Typically, water is employed as the droplet 51, in a case where the electrowetting device 1 is an electrowetting display device. Note, however, that the droplet 51 is not limited to a particular one, provided that the droplet 51 can be manipulated by electrowetting. Examples of the droplet 51 include a whole blood sample, a bacterial cell suspension, a protein solution, an antibody solution, and various kinds of buffer solutions.

The non-ionic liquid 52 is not limited to a particular one, provided that it does not mix with the droplet 51. Employed as the non-ionic liquid 52 is typically a liquid whose surface tension is smaller than that of the droplet 51. Examples of the non-ionic liquid 52 include: a hydrocarbon-based solvents (low molecular hydrocarbon-based solvent) such as decane, dodecane, hexadecane, and undecane; an oil such as a silicone oil; and a fluorocarbon-based solvent. Examples of the silicone oil include dimethyl polysiloxane. Those examples of the non-ionic liquid 52 can be used alone or in combination of two or more kinds as appropriate.

Selected as the non-ionic liquid 52 is, for example, a liquid whose specific gravity is smaller than that of the droplet 51. The specific gravity of the droplet 51 is substantially equal to that of water (i.e., 1.0), in a case where the droplet 51 is an electrolyte solution. In such a case, a liquid, whose specific gravity is less than 1.0 (e.g., silicone oil or the like), is employed as the non-ionic liquid 52.

The droplet 51 and the non-ionic liquid 52 each preferably have a low viscosity. The viscosity of the droplet 51 can be adjusted, by diluting the droplet 51 with water or the like, so that the droplet 51 has a given viscosity.

The following description will specifically discuss an example of a process of producing an electrowetting device 1 in accordance with Embodiment 1.

Figure 5:
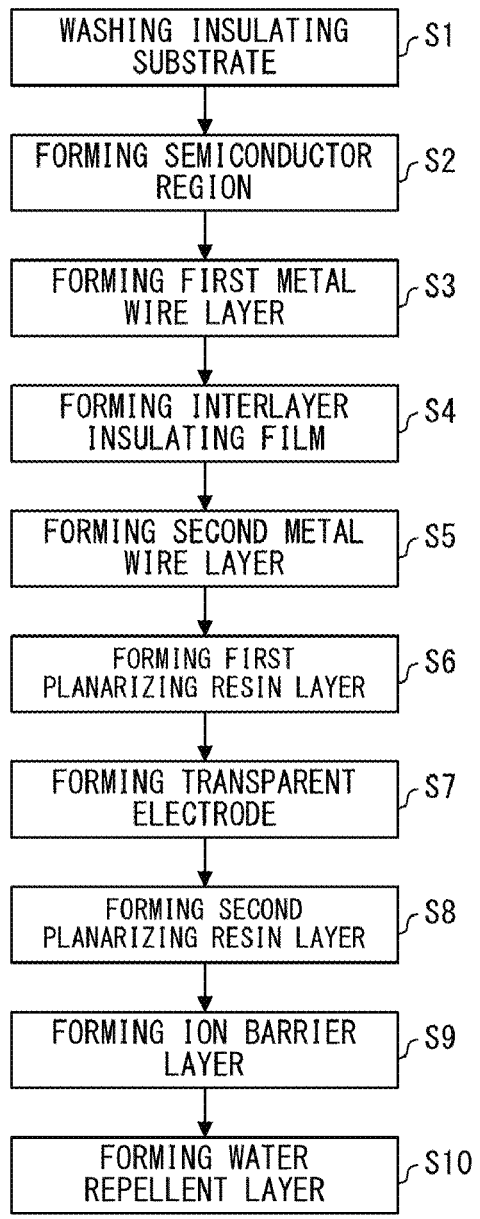
FIG. 5 is a flowchart illustrating a process of producing of the electrode substrate in accordance with Embodiment 1 of the present invention.
Figure 6:
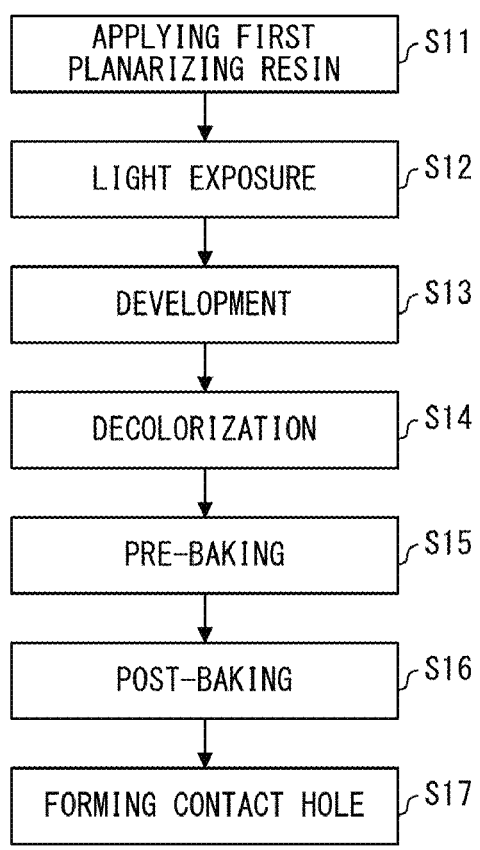
FIG. 6 is a flowchart illustrating a formation process of a first planarizing resin layer in the step S6 of FIG. 5.

FIG. 5 is a flowchart illustrating a process of producing an electrode substrate 10 in accordance with Embodiment 1. FIG. 6 is a flowchart illustrating a formation process of a first planarizing resin layer in the step S6 of FIG. 5.

The electrode substrate 10 in accordance with Embodiment 1 is produced by adding, to a conventional process of producing a TFT, a process of planarizing a contact hole 19. The electrode substrate 10 in accordance with Embodiment 1 can therefore be produced with the use of a conventional TFT substrate.

The method of producing the electrode substrate 10 in accordance with Embodiment 1 includes: an insulating substrate washing step (step S1); a semiconductor region forming step (step S2); a first metal wire layer forming step (step S3); an interlayer insulating film forming step (step S4); a second metal wire layer forming step (step S5); a first planarizing resin layer forming step (step S6); a transparent electrode forming step (step S7, electrode forming step); a second planarizing resin layer forming step (step S8); an ion barrier layer forming step (step S9); and a water repellent layer forming step (step S10) (see FIG. 5). Of those steps, the steps S1 through S5 constitute a TFT forming step (active element forming step), and the steps S8 and S9 constitute a dielectric layer forming step.

During production of the electrode substrate 10 in accordance with Embodiment 1, the insulating substrate washing step (step S1) through the transparent electrode forming step (step S7) are carried out in accordance with the conventional process of preparing a TFT substrate.

First, an insulating substrate 11 is washed which is made of, for example, a large-sized glass substrate having a thickness of 0.7 mm (step S1).

Next, as has been discussed, an island-like semiconductor layer 21, having a p-type semiconductor region and an n-type semiconductor region, is formed on the insulating substrate 11 by a method in common use (step S2).

Typically, a semiconductor layer 21 is first formed on the insulating substrate 11 by use of a CVD method or the like, and then a region of the semiconductor layer 21, which region serves as an active layer, is covered with a resist which serves as a mask. After that, a region of the semiconductor layer 21, which region is not covered with the resist, is removed by etching with the use of, for example, a dry etching machine. The semiconductor layer 21 is thus formed in the island-like manner.

Note that, in a case where the semiconductor layer 21 is made of a CGS, the semiconductor layer 21 can be formed on the insulating substrate 11 by, for example, (i) adding a metal catalyst to an amorphous silicon film, which is accumulated on the insulating substrate 11 by a plasma CVD with the use of a $SiH_4$ gas, and then (ii) carrying out a thermal treatment so that a continuous grain boundary crystal grows. Employed as the metal catalyst is a catalyst containing a metal atom such as nickel (Ni), platinum (Pt), tin (Sn), or palladium (Pd). The method of adding the metal catalyst is not limited to a particular method, and can be, for example, a method in which the amorphous silicon is spin-coated with a nickel acetate solution.

Subsequently, by use of an ion doping method, a p-type impurity and an n-type impurity are added, via a gate insulating film 22, to respective regions of the semiconductor layer 21 formed in the island-like manner. This causes a source region 21b and a drain region 21c to be formed in the semiconductor layer 21. Note that a resist mask is used to selectively add an impurity atom to a given region.

After that, the gate insulating film 22 is formed on the insulating substrate 11 by the common method discussed earlier, so as to cover the semiconductor layer 21 formed in the island-like manner. On the gate insulating film 22 thus formed, a first metal wire layer 23 is formed which includes a gate electrode 23A, gate wires GL, and the like (step S3).

The gate insulating film 22 can be, for example, a silicon oxide film or a silicon nitride film each of which is formed by a CVD method or the like, and can be a single layer or can be made up of a plurality of layers.

Pattern formation of a first metal wire layer 23 can be realized as follows. Specifically, for example, (i) a tungsten film, which is an electrically conductive film (i.e., wire metal) and which is to ultimately become the first metal wire layer 23, is formed by use of a sputtering method under an atmosphere of a mixed gas of (a) carbon tetrafluoride ($CF_4$), (b) chlorine ($Cl_2$), and (c) oxygen ($O_2$), (ii) a resist mask is formed on a given region of the electrically conductive film, and then (iii) dry etching is carried out (step S3).

Note that, alternatively, after formation of the semiconductor layer 21 in the island-like manner, the gate insulating film 22 and the first metal wire layer 23 can be formed, and then the source region 21b and the drain region 21c can be formed by an ion doping method. That is, the order of the steps S2 and S3 can be reversed.

Then, an interlayer insulating film 24 is formed so as to cover the first metal wire layer 23 (step S4). The interlayer insulating film 24 can be formed, by use of a CVD method, under an atmosphere of a mixed gas of (a) carbon tetrafluoride ($CF_4$) and (b) oxygen ($O_2$). The interlayer insulating film 24 can be, for example, a silicon oxide film or a silicon nitride film, and can be a single layer or can be made up of a plurality of layers.

After formation of the interlayer insulating film 24, a resist mask is formed on a region of the interlayer insulating film 24 which region is located above the drain region 21c, and then etching is carried out so that apertures which serve as respective contact holes 26 are secured in the interlayer insulating film 24. The etching is carried by use of a dry etching method, a wet etching method, or other method.

Next, as in the case of the first metal wire layer 23, a patterned second metal wire layer 25 is formed as follows which includes a source electrode 25A, a drain electrode 25B, source wires SL, and the like. Specifically, for example, (i) an aluminum film serving as an electrically conductive film (i.e., wire metal), which is to ultimately become the second metal wire layer 25, is formed on the interlayer insulating film 24 by use of a sputtering method, (ii) a resist mask is provided on a certain region of the electrically conductive film, and then (iii) etching is carried out (step S5).

This causes the drain electrode 25B to be electrically connected to the drain region 21c, via a contact hole 26, after formation of the second metal wire layer 25. The TFT 20 is thus formed.

By thus forming the TFT 20 on the insulating substrate 11, a surface of the interlayer insulating film 24 (i.e., a surface of the thin film electronic circuitry layer 12 including the TFT 20) has an unevenness whose difference of elevation is not greater than 1600 nm.

By thus forming a first planarizing resin layer 13 on the interlayer insulating film 24, the surface of the interlayer insulating film 24 is planarized (step S6).

The first planarizing resin layer forming step (step S6) includes (i) a first planarizing resin applying step (step S11), (ii) a light exposure step (step S12), (iii) a developing step (step S13), (iv) a decolorizing step (step S14), (v) a pre-baking step (step S15), (vi) a post-baking step (step S16), and (vii) a contact hole forming step (step S17) (see FIG. 6).

In the first planarizing resin layer forming step, a first planarizing resin, which serves as the first planarizing resin layer 13, is first applied onto the interlayer insulating film 24 so as to cover the second metal wire layer 25 (see FIG. 6) (step 11).

The first planarizing resin layer 13 of Embodiment 1 is formed by, for example, applying, onto the insulating substrate 11 with the use of a slit coater, a photosensitive acrylate material "OPTOMER (registered trademark)—PC-403" (manufactured by JSR Corporation) so that the photosensitive acrylate material has a thickness of 2300 nm. Note that ultraviolet irradiation causes "OPTOMER (registered trademark)—PC-403" to lose its color.

Next, the insulating substrate 11, on which the first planarizing resin layer 13 has been formed, is subjected to ultraviolet (UV) exposure with the use of a photomask (step S12), and is then developed by being dipped into a developing solution (e.g., 0.1% tetramethylammonium hydroxide (TMAH) solution) for 200 seconds. The first planarizing resin layer 13 is thus patterned (step S13).

Next, the insulating substrate 11 is irradiated with UV whose intensity is 2000 mJ/cm$^2$ so that the first planarizing resin layer 13 is decolorized (step S14).

Subsequently, the insulating substrate 11 is subjected to pre-baking at 100° C. for 10 minutes (step S15), and is then subjected to post-baking at 220° C. for an hour (step S16).

After that, a contact hole 19 is secured in the first planarizing resin layer 13, by (i) providing a resist mask in a region of the first planarizing resin layer 13 which region is located above the drain electrode 25B and then (ii) carrying out etching (step S17). The etching is carried out by a dry etching method or a wet etching method.

The contact hole 19 of Embodiment 1 is formed, for example, to have (i) an aperture diameter (diameter) of 5 μm on a boundary surface between the first planarizing resin layer 13 and the drain electrode 25B and (ii) a height of 2 μm.

The first planarizing resin layer 13, having (i) the contact hole 19 and (ii) a thickness of 2 μm after the post-baking, is thus formed in the step S6.

Next, by use of a sputtering method, there is formed, on the first planarizing resin layer 13, for example, an ITO film that is a transparent electrically conductive film which is to become an electrode 14. A patterned electrode 14, having a thickness of, for example, 100 nm, is then formed as a transparent electrode (i.e., ITO pattern), by (i) providing a resist mask on a given region of the transparent electrically conductive film and then (ii) carrying out etching (step S7).

This causes the drain electrode 25B of the TFT 20 to be electrically connected to the electrode 14, via the contact hole 19, after formation of the electrode 14.

By thus electrically connecting the electrode 14 to the TFT 20, via the contact hole 19 secured in the first planarizing resin layer 13, unevenness whose difference of elevation is 2 μm and which is caused by the contact hole 19 is formed on the surface of the first planarizing resin layer 13, i.e., on the surface of the electrode 14 formed on the first planarizing resin layer 13.

According to Embodiment 1, after the formation of the electrode 14, another planarizing resin layer is formed so that the surface of the electrode 14 is planarized. That is, the surface of the electrode substrate 10 is planarized by applying first and second planarizing resins to the thin film electronic circuitry layer 12 in a state where the electrode 14 is sandwiched by the first and second planarizing resins.

More specifically, according to Embodiment 1, the contact hole 19 is filled with the second planarizing resin layer 16. This causes the contact hole 19 to be planarized, and ultimately causes the surface of the first planarizing resin layer 13 to be planarized (step S8).

The second planarizing resin layer forming step (step S8) is similar to the first planarizing resin layer forming step (see FIG. 6), except that the following points: (i) a second planarizing resin layer 16 is formed which has a pattern different from that of the first planarizing resin layer 13 and (ii) no contact hole is secured in the second planarizing resin layer 16.

That is, the second planarizing resin layer forming step (step S8) includes, as with the first planarizing resin layer forming step, (i) a second planarizing resin applying step, (ii) a light exposure step, (iii) a developing step, (iv) a decolorizing step, (v) a pre-baking step, and (vi) a post-baking step.

According to Embodiment 1, after the electrode 14 is formed in the step S7, a second planarizing resin, which is to become the second planarizing resin layer 16, is applied to the first planarizing resin layer 13 so as to cover the electrode 14 inside the contact hole 19.

As with the case of the first planarizing resin, the second planarizing resin layer 16 of Embodiment 1 is formed by, for example, applying, with use of a slit coater, a photosensitive acrylate material "OPTOMER (registered trademark)—PC-403" (manufactured by JSR Corporation) which is to become the second planarizing resin so that the photosensitive acrylate material has a thickness of 2300 nm. Note that ultraviolet irradiation causes "OPTOMER (registered trademark)—PC-403" to lose its color.

After that, under the same process conditions as those employed in the first planarizing resin layer forming step, (i) light exposure, (ii) development, (iii) decolorization, (vi) pre-baking, and (v) post-baking are carried out with the use of a photomask, which is different from that used in the step S12.

As such, the contact hole 19 is filled with the second planarizing resin layer 16 so that its surface is coplanar with the surface of the electrode 14 outside the contact hole 19 (see FIG. 1).

Next, an ion barrier layer 17 is formed on the insulating substrate 11 so as to cover the second planarizing resin layer 16, the electrode 14, and the first planarizing resin layer 13 (step S9). In Embodiment 1, (i) the ion barrier layer 17, which is made of silicon nitride (SiNx) and has a thickness of 250 nm, is formed by use of, for example, a CVD method, and then (ii) the ion barrier layer 17 is patterned as necessary by photolithography so that an external connection part such as a connection wire 38 or the like is exposed.

After that, a water repellent layer forming step (water repellent treatment step) is carried out so that a water repellent layer 18 is formed on the insulating substrate 11, on which the ion barrier layer 17 has been formed (step S10).

For example, the insulating substrate 11 on which the ion barrier layer 17 has been formed is dipped into a water repellent agent (e.g., 1 wt % diluted solution of a perfluoroamorphos resin "CYTOP (registered trademark)—CTL107MK" (manufactured by AGC Asahi Glass Co., Ltd.)) so that an entire surface of the insulating substrate 11 is dip-coated with the water repellent agent.

Specifically, the insulating substrate 11 on which the ion barrier layer 17 has been formed is (i) dipped, at a speed of 5 mm/sec, into a container (not illustrated) which is filled with the water repellent agent, (ii) kept in the container for 60 seconds, and then (iii) pulled out of the container at a speed of 1 mm/sec. A water repellent layer 18 (CYTOP film), having a thickness of 50 nm, is thus formed over the entire surface of the insulating substrate 11.

After that, the insulating substrate 11 is cut so as to have a desired size as necessary, and its surface is washed. Note that the insulating substrate 11 can be cut, as necessary, so as to have a desired size, before the water repellent layer 18 is formed on the insulating substrate 11.

An electrode substrate 10 is thus completed on which the water repellent layer 18 is formed as a hydrophobic surface (water-repellent surface).

After that, with the use of a sealant (not illustrated), the electrode substrate 10 is attached to an opposite substrate 40 prepared similarly to a conventional technique so that the electrodes 14 and 42 face each other. In so doing, in a case where the electrowetting device 1 is, for example, an electrowetting display device, (i) a droplet 51 or (ii) the droplet 51 and a non-ionic liquid 52 is/are, as necessary, sealed between the electrode substrate 10 and the opposite substrate 40. An electrowetting device 1 (i.e., cell 2) in accordance with Embodiment 1 is thus produced.

Note that, as with the case of the electrode substrate 10, the opposite substrate 40 can be prepared by, for example, forming a water repellent layer 43 on an insulating substrate 41 on which a solid ITO film has been provided as an electrode 42.

In a case where the electrowetting device 1 is, for example, an analyzing device, the method can further include a step of securing, in a side surface of the opposite substrate 40 or the cell 2, an aperture (not illustrated) into which a liquid is injected.

<Effect>

The following description will discuss, with reference to Comparative Example, an effect brought about by the electrode substrate 10 in accordance with Embodiment 1.

Comparative Example (a) and (b) of FIG. 7 through (a) and (b) of FIG. 9 are each a view showing a scanning electron microscope (SEM) photograph of a cross section of a main part of a comparative electrode substrate, which was prepared without filling a contact hole 319 with a second planarizing resin layer.

Note that (b) of FIG. 7 is a view showing an SEM photograph of a cross section of a bottom edge of a contact hole 319 of the electrode substrate illustrated in (a) of FIG. 7. (b) of FIG. 8 is a view showing an SEM photograph of a cross section of a bottom edge of a contact hole 319 of the electrode substrate illustrated in (a) of FIG. 8. Similarly, (b) of FIG. 9 is a view showing an SEM photograph of a cross section of a bottom edge of a contact hole 319 of the electrode substrate illustrated in (a) of FIG. 9.

FIG. 10 is a view showing an SEM photograph of a water repellent layer 318 of the comparative electrode substrate which was prepared without filling a contact hole 319 with a second planarizing resin layer, the SEM photograph being taken from above a contact hole 319.

In the examples illustrated in (a) and (b) of FIG. 7 through FIG. 10, the comparative electrode substrate was produced by carrying out the steps S9 and S10 without carrying out the step S8, after the steps S1 through S7 illustrated in FIG. 6 were carried out.

That is, as with Embodiment 1, a thin film electronic circuitry layer 312 including a TFT, which is similar in configuration to the TFT 20, was first formed on an insulating substrate 311 by the method illustrated in FIG. 6 (see FIG. 15).

After that, by use of the method illustrated in FIGS. 6 and 7, a planarizing resin layer 313, which is similar to the first planarizing resin layer 13 of Embodiment 1, was formed on the thin film electronic circuitry layer 312, and then a contact hole 319, which is similar to the contact hole 19, was secured in the planarizing resin layer 313 thus formed.

Subsequently, as with the case of the electrode 14 in accordance with Embodiment 1, an electrode 314, made of ITO, was formed on the first planarizing resin layer 313 by use of the method illustrated in FIG. 6.

After that, as with the case of the ion barrier layer 17 in accordance with Embodiment 1, an ion barrier layer 317 was formed on the planarizing resin layer 313, which has unevenness caused by the contact hole 319 similarly to a conventional technique, by use of the method illustrated in FIG. 6, so as to cover the electrode 314 (see (a) and (b) of FIG. 7 through (a) and (b) of FIG. 9).

Then, as with the case where the water repellent layer 18 was formed, a water repellent layer 318 (i.e., CYTOP film) was formed, with a water repellent agent, on an entire surface of the insulating substrate 311 including the inside of the contact hole 319, by dip-coating the insulating substrate 311 on which the ion barrier layer 317 had been formed, with the use of the method which was described with reference to FIG. 6 (see (a) and (b) of FIG. 7 through (a) and (b) of FIG. 9 and FIG. 15). Further, a protection film 320 for processing a cross section of an electrode substrate was formed on the water repellent layer 318, by (i) vapor-depositing gold (Au) with the use of the resistance heating and then (ii) sputtering platinum (Pt) with the use of a gallium (Ga) beam so that the platinum had a thickness of 1 μm.

As is clear from (a) and (b) of FIG. 7, a water repellent agent forming the water repellent layer 318 was collected on a bottom edge of the contact hole 319. This led to a difference in thickness of the water repellent layer 318 between the water repellent layer 318 on the bottom edge of the contact hole 319 and the other parts of the water repellent layer 318.

According to the example illustrated in (a) and (b) of FIG. 8, the water repellent layer 318 had a crack and almost peeled off from the bottom edge of the contact hole 319.

According to the example illustrated in (a) and (b) of FIG. 9, the water repellent layer 318 peeled off and went away.

According to the example illustrated in FIG. 10, the water repellent layer 318 had cracks around the contact hole 319.

As with the case of Patent Literature 1, in a case where the TFT substrate, which has unevenness caused by the contact hole 319, is dip-coated with a water repellent agent without filling the contact hole 319 with a second planarizing resin layer, (i) the water repellent layer 318 may have a crack and (ii) the water repellent agent may be applied while floating. This causes the water repellent layer 318 to be easily peeled off. Such problems caused by the water repellent layer 318 adversely affect electrowetting performance.

Example

FIG. 11 is a view showing an SEM photograph of a water repellent layer 18 of an electrode substrate 10 in accordance with Embodiment 1, which was produced by the method illustrated in FIGS. 6 and 7, the SEM photograph being taken from above a contact hole 19. FIG. 12 is a perspective view illustrating how droplets 51A and 51B moved on the electrode substrate 10 in accordance with Embodiment 1, in a case where the droplets 51A and 51B were used as the droplet 51. Note that wires and the like are omitted in FIG. 12.

According to Embodiment 1, as has been discussed, a planarizing resin is applied twice so that the contact hole 19 is filled with the second planarizing resin layer 16. This makes it possible to flatten the surface of the ion barrier layer 17 (see FIG. 1). This ultimately makes it possible to achieve a flat dense water repellent layer 18 having a high adhesion to the ion barrier layer 17 serving as a base (see FIG. 11).

As a result, according to Embodiment 1, the droplets 51A and 51B each smoothly moved, instead of getting stuck while moving (see FIG. 12). Embodiment 1 therefore allows an improvement in electrowetting performance, as compared with a conventional technique. It is therefore possible to provide an electrowetting device 1 which is more excellent in electrowetting performance than a conventional technique.

Furthermore, according to Embodiment 1, the second planarizing resin layer 16 is merely provided inside the contact hole 19. This allows (i) a reduction in materials to be used and (ii) a reduction in thickness of the electrode substrate 10.

As described above, the electrode substrate 10 in accordance with Embodiment 1 has the following advantages (i) and (ii). Specifically, (i) the electrode substrate 10 excels in flatness of a surface on which the electrode 14 is provided and (ii) the water repellent layer 18 is hard to peel off. Therefore, the electrode substrate 10 in accordance with Embodiment 1 can be especially suitable for an application such as the electrowetting device 1 in which the water repellent layer 18 is required to have flatness and adhesion.

Furthermore, the electrowetting device 1 can be used for various purposes such as (i) an electrowetting display device (i.e., electrowetting display (EWD)) in which, for example, (a) water and colored oil are employed as display mediums and (b) electrowetting phenomenon is utilized as a display; (ii) an analyzing device; and (iii) a measuring device.

<Variation>

Note that FIG. 3 illustrates the example where the water repellent layer 43 is merely provided on a surface of the opposite substrate 40 which surface faces the electrode substrate 10. Embodiment 1 is, however, not limited as such. A water repellent layers 43 can be provided on each of (i) the surface of the opposite substrate 40 which surface faces the electrode substrate 10 and (ii) at least a part of the other surface of the opposite substrate 40, depending on the purposes and the method of producing the electrowetting device 1. Alternatively, the water repellent layer 43 can be provided on all surfaces of the opposite substrate 40.

Similarly, FIG. 3 illustrates the example where the water repellent layer 18 is merely provided on a surface of the electrode substrate 10 which surface faces the opposite substrate 40. However, the water repellent layer 18 can be further provided on the other surface of the electrode substrate 10, in addition to the surface of the electrode substrate 10 which surface faces the opposite substrate 40. Alternatively, the water repellent layer 18 can be provided on whole surfaces of the electrode substrate 10.

Furthermore, Embodiment 1 has discussed the example where (i) the dielectric layer 15 is made up of, for example, (a) the second planarizing resin layer 16 made of a photosensitive acrylate material and (b) the ion barrier layer 17 made of silicon nitride (SiNx) and (ii) the contact hole 19 is filled with the second planarizing resin layer 16. Embodiment 1 is, however, not limited as such. The second planarizing resin layer 16 and the ion barrier layer 17 each can have a multilayer structure.

Note that at least one second planarizing resin layer 16 and at least one ion barrier layer 17 are each required to be provided. Therefore, a plurality of second planarizing resin layers 16 and a plurality of ion barrier layers 17 each can be provided. For example, the dielectric layer 15 can have the following laminated structures: (i) a laminated structure in which a plurality of second planarizing resin layers 16 and at least one ion barrier layer 17 are stacked, (ii) a laminated structure in which at least one second planarizing resin layer 16 and a plurality of ion barrier layers 17 are stacked, or (iii) a laminated structure in which second planarizing resin layers 16 and ion barrier layers 17 are alternately provided.

Similarly, the water repellent layer 18 can be made up of a plurality of layers. For example, the water repellent layer 18 can have a double layer structure of (i) a first layer that can secure adhesion to the dielectric layer 15 and (ii) a water repellent layer, having a high water repellency, which is formed on the first layer.

Embodiment 21

Embodiment 2 will be discussed below with reference to FIG. 13. Note that the description below will mainly discuss how Embodiment 2 differs from Embodiment 1. Members identical in function to those discussed in Embodiment 1 will be given the same reference numerals, and descriptions thereof will be omitted.

<Schematic Configuration of Electrowetting Device 1>

FIG. 13 is a sectional view schematically illustrating an example of a main configuration of an electrode substrate 10 in accordance with Embodiment 2.

An electrowetting device 1 in accordance with Embodiment 2 is identical in configuration to the electrowetting device 1 in accordance with Embodiment 1, except for the following point. Specifically, in the electrode substrate 10, a second planarizing resin layer 16 directly covers an electrode 14 inside and outside a contact hole 19 (see FIG. 13).

The second planarizing resin layer 16 is stacked on a first planarizing resin layer 13 so as to (i) fill up the contact hole 19 and (ii) very thinly cover the electrode 14 outside the contact hole 19. This allows planarization of unevenness of a surface of the first planarizing resin layer 13 caused due to the contact hole 19 and the electrode 14.

On the electrode 14 outside the contact hole 19, the second planarizing resin layer 16 preferably has a thickness which falls within a range of 10 nm to 10 μm, more preferably has a thickness which falls within a range of 500 nm to 1 μm. Specifically, in a case where the second planarizing resin layer 16 has a thickness, on the electrode 14 outside the contact hole 19, which falls within a range of 500 nm to 1 μm, it is possible to (i) bring about a sufficient planarizing effect, (ii) secure insulation performance of an ion barrier layer 17, and (iii) secure electrostatic capacitance necessary for electrowetting.

In view of the circumstances, according to Embodiment 2, the ion barrier layer 17, having a uniform thickness, is provided on the second planarizing resin layer 16, having a flat surface, so as to be separated from the electrode 14.

The water repellent layer 18, having a uniform thickness, is provided on the ion barrier layer 17 so as to have a flat surface.

<Method of Producing Electrowetting Device 1>

The electrowetting device 1 in accordance with Embodiment 2 can be produced by a method similar to that discussed in Embodiment 1, except for changing, in the second planarizing resin layer forming step (step S8) of Embodiment 1, (i) a slit coating condition such as a coating gap between inside and outside of the contact hole 19 and (ii) a photolithography condition.

In Embodiment 2, the second planarizing resin layer 16 provided on the electrode 14 outside the contact hole 19 is retained instead of being removed. This makes it possible to simultaneously pattern, by one photolithography, (i) the second planarizing resin layer 16 and (ii) the ion barrier layer 17 after formation of the ion barrier layer 17.

Note that each layer of Embodiment 2 is identical in thickness to a corresponding layer of Embodiment 1, except that a thickness of the second planarizing resin layer 16 is increased by a thickness, by which the second planarizing resin layer 16 very thinly covers the electrode 14 outside the contact hole 19.

<Effect>

According to Embodiment 2, the contact hole 19 is filled with the second planarizing resin layer 16. This brings about the same effect as that brought about by Embodiment 1.

Note that the insulation performance and a leakage resistance of the ion barrier layer 17 are fundamental to the electrowetting device 1.

In a case where an electric field is applied to a droplet 51, ions contained in the droplet 51 move. However, an inorganic layer, such as the ion barrier layer 17, has a defect at a molecular level. If the ions contained in the droplet 51 reach the electrode 14 through defects of the water repellent layer 18 and the ion barrier layer 17, then a leakage occurs.

A dielectric constant becomes high, in a case where an ion barrier layer 17, made of an inorganic material, is employed in a dielectric layer 15. This leads to a decrease in voltage required for moving the droplet 51, whereas this causes an increase in risk of lowering resistance to leakage.

According to Embodiment 2, the second planarizing resin layer 16 covers the electrode 14 outside the contact hole 19. The second planarizing resin layer 16, thus provided on the electrode 14, allows an increase in insulation performance. It is therefore possible to secure the insulation performance of the ion barrier layer 17.

A resin layer has a property of (i) repelling an ionic liquid such as water and (ii) being hard to pass ions therethrough. Therefore, the second planarizing resin layer 16, which covers the electrode 14 outside the contact hole 19, allows the leakage resistance of the ion barrier layer 17 to be reinforced. This ultimately allows an improvement in leakage resistance of the electrode substrate 10.

Moreover, according to Embodiment 2, a larger margin can be secured in a photolithography condition of the second planarizing resin layer 16, as compared with Embodiment 1 in which the second planarizing resin layer 16 is merely provided inside the contact hole 19.

Furthermore, according to Embodiment 2, since the second planarizing resin layer 16 covers the electrode 14 outside the contact hole 19, it is possible to achieve more perfect planarization of a surface of the electrode substrate 10.

A flatness of the water repellent layer 18 depends on a flatness of a planarizing layer provided on a thin film electronic circuitry layer 12, i.e., depends on a flatness of a planarizing layer provided on a TFT 20. A resin layer enhances a planarizing effect. Since the second planarizresin layer 16 covers the electrode 14 outside the contact hole 19, it is possible to improve flatness of the water repellent layer 18.

According to a measurement made by an atomic force microscope, the electrode 14 has an average roughness of 11.5 nm, in contrast to the second planarizing resin layer 16, covering the electrode 14, which has a small average roughness of 2.32 nm. This demonstrates that the second planarizing resin layer 16, which covers the electrode 14 outside the contact hole 19, allows an improvement in flatness of the water repellent layer 18.

In especial, the electrode 14, as has been discussed, has a thickness of, for example, 100 nm. It follows that a difference of elevation, caused by the electrode 14, is extremely smaller as compared with a height of the contact hole 19. Unlike a difference of elevation caused by the contact hole 19, the difference of elevation caused by the electrode 14 may not give rise to a crucial problem. In a case where (i) the droplet 51 repeatedly goes back and forth a difference of elevation located between adjacent electrodes 14, (ii) such a difference of elevation is small, and (iii) manipulations of the droplet 51 are repeated, the water repellent layer 18 can, however, peel off at a corner part of an electrode 14 and so forth. This may adversely affect the electrowetting performance. In contrast, according to Embodiment 2, such a problem can be prevented, because the second planarizing resin layer 16 can remove such a difference of elevation between the adjacent electrodes 14. This ultimately allows a further improvement in reliability.

Embodiment 3

The following description will discuss Embodiment 3 with reference to FIG. 14. Note that the description below will mainly discuss how Embodiment 3 differs from Embodiments 1 and 2. Members identical in function to those discussed in Embodiments 1 and 2 will be given the same reference numerals, and descriptions thereof will be omitted.

<Schematic Configuration of Electrowetting Device 1>

FIG. 14 is a sectional view schematically illustrating an example of a main configuration of an electrode substrate 10 in accordance with Embodiment 3.

An electrowetting device 1 in accordance with Embodiment 3 is similar in configuration to the electrowetting devices 1 in accordance with respective Embodiments 1 and 2, except that, in the electrode substrate 10, an ion barrier layer 17 is provided between an electrode 14 and a second planarizing resin layer 16 (see FIG. 14).

Specifically, according to Embodiment 3, the ion barrier layer 17 directly covers the electrode 14 inside and outside a contact hole 19. The second planarizing resin layer 16 is stacked on the ion barrier layer 17 so as to (i) fill up inside of the contact hole 19 via the ion barrier layer 17 and (ii) very thinly cover the ion barrier layer 17 outside the contact hole 19.

As with Embodiment 1, on the electrode 14 outside the contact hole 19, the second planarizing resin layer 16 preferably has a thickness which falls within a range of 10 nm to 10 µm, more preferably has a thickness which falls within a range of 500 nm to 1 µm. Specifically, as discussed in Embodiment 1, in a case where the second planarizing resin layer 16 has a thickness which falls within a range of 500 nm to 1 µm on the electrode 14 outside the contact hole 19, it is possible to (i) bring about a sufficient planarizing effect, (ii) secure insulation performance of the ion barrier layer 17, and (iii) secure electrostatic capacitance necessary for electrowetting.

As with Embodiments 1 and 2, according to Embodiment 3, a water repellent layer 18, having a uniform thickness, is provided on the ion barrier layer 17 having a flat surface.

<Method of Producing Electrowetting Device 1>

The electrowetting device 1 in accordance with Embodiment 3 can be produced by a method similar to that discussed in Embodiment 2, except that the ion barrier layer forming step (step S9) and the second planarizing resin layer forming step (step S8) of Embodiment 2 are carried out in a reversed order.

That is, in Embodiment 3, a patterned electrode 14 is formed in the step S7, and then the ion barrier layer 17 is formed on a first planarizing resin layer 13 so as to cover the electrode 14 as in the step S9. After that, the second planarizing resin layer 16 is formed on the ion barrier layer 17 as in the step S8, and then the water repellent layer 18 is formed on the second planarizing resin layer 16 as in the step S10. Note that each layer of Embodiment 3 is identical in thickness to a corresponding layer of Embodiment 2.

<Effect>

According to Embodiment 3, the contact hole 19 is filled with the second planarizing resin layer 16, and the second planarizing resin layer 16 covers, via the ion barrier layer 17, the electrode 14 outside the contact hole 19. This brings about the same effects as those brought about by respective Embodiments 1 and 2.

In a case where an insulator is used in a display medium as in the case of a liquid crystal panel, a high requirement is not made to a layer provided on the electrode 14 which serves as a pixel electrode. However, in the case of the electrowetting device 1, a quality of and a density of a layer, provided on the electrode 14, are fundamental.

In Embodiment 2, the ion barrier layer 17 is provided on the second planarizing resin layer 16. There is concern that the ion barrier layer 17 may be degraded in quality due to a gas degassed from the second planarizing resin layer 16. However, according to Embodiment 3, the ion barrier layer 17 is directly provided on the electrode 14 across almost an entire region of the electrode substrate 10. This causes the above concern to be less likely to occur.

[Recap]

An electrode substrate 10 in accordance with a first aspect of the present invention includes: an insulating substrate 11; an active element (e.g., TFT 20) provided on the insulating substrate 11; a first planarizing resin layer 13 which covers the active element; an electrode 14 connected to the active element, via a contact hole 19 which is secured in the first planarizing resin layer 13; a dielectric layer 15 which covers the electrode 14; and a water repellent layer 18 which covers the dielectric layer 15, the dielectric layer 15 including at least one second planarizing resin layer 16 and at least one ion barrier layer 17 which is made of an inorganic material, the contact hole 19 being filled with the dielectric layer 15 including the at least one second planarizing resin layer 16.

According to the above configuration, (i) the planarizing resin layer is formed from at least two layers, i.e., the first planarizing resin layer 13 which covers the active element and the second planarizing resin layer 16 with which the contact hole 19 is filled, and (ii) the contact hole 19 is filled with the second planarizing resin layer 16. This makes it possible to achieve a flat dense water repellent layer 18 having a high adhesion to a base.

The above configuration therefore makes it possible to provide an electrode substrate 10 which (i) includes a water repellent layer 18 whose adhesion to a base is higher than that of a conventional technique, (ii) can prevent the water repellent layer 18 from peeling off, and (iii) can be suitably used in, for example, an electrowetting device 1.

The electrode substrate 10 in accordance with a second aspect of the present invention can be configured such that, in the first aspect of the present invention, the second planarizing resin layer 16 is provided so as to cover the electrode 14 outside the contact hole 19.

With the above configuration, the second planarizing resin layer 16 provided on the electrode 14 allows an improvement in insulation performance. This makes it possible to secure insulation performance of the ion barrier layer 17.

A resin layer has a property of (i) repelling an ionic liquid such as water and (ii) being hard to transmit ions therethrough. Therefore, the above configuration allows a leakage resistance of the ion barrier layer 17 to be reinforced. This ultimately allows an improvement in leakage resistance of the electrode substrate 10.

Moreover, with the above configuration, a larger margin is secured in a photolithography condition of the second planarizing resin layer 16, as compared with a case where the second planarizing resin layer 16 is merely provided inside the contact hole 19.

Furthermore, according to the above configuration, the second planarizing resin layer 16 covers the electrode 14 outside the contact hole 19. This makes it possible to achieve more perfect planarization of a surface of the electrode substrate 10, and ultimately allows a further improvement in reliability.

The electrode substrate 10 in accordance with a third aspect of the present invention can be configured such that, in the second aspect of the present invention, the ion barrier layer 17 is provided on the second planarizing resin layer 16.

The above configuration makes it possible to flatten a surface of the ion barrier layer 17. This allows an improvement in adhesion between the water repellent layer 18 and the ion barrier layer 17 serving as a base of the water repellent layer 18.

The electrode substrate 10 in accordance with a fourth aspect of the present invention can be configured such that, in the second aspect of the present invention, the ion barrier layer 17 is provided between the electrode 14 and the second planarizing resin layer 16.

The above configuration brings about an effect of preventing the ion barrier layer 17 from being degraded in quality due to a gas degassed from the second planarizing resin layer 16, in addition to the effects brought about by the first and second aspects.

The electrode substrate 10 in accordance with a fifth aspect of the present invention can be configured such that, in the first aspect of the present invention, the second planarizing resin layer 16 is merely provided inside the contact hole 19; and the ion barrier layer 17 is provided so as to cover the second planarizing resin layer 16 and the electrode 14.

According to the above configuration, the second planarizing resin layer 16 is merely provided inside the contact hole 19. This allows (i) a reduction in materials used and (ii) a reduction in thickness of the electrode substrate 10, in addition to the effects brought about by the first aspect.

An electronic device (e.g., electrowetting device 1) in accordance with a sixth aspect of the present invention includes an electrode substrate 10 in accordance with any one of the first through fifth aspects of the present invention.

According to the above configuration, the electronic device includes the electrode substrate 10. This makes it possible to provide an electronic device which (i) includes a water repellent layer 18 whose adhesion to a base is higher than that of a conventional technique and (ii) can prevent the water repellent layer 18 from peeling off.

The electronic device (e.g., electrowetting device 1) in accordance with a seventh aspect of the present invention can be configured to further include, in the sixth aspect of the present invention, an opposite substrate 40 provided so as to be opposed to the electrode substrate 10, the electronic device being an electrowetting device in which a droplet 51, placed between the electrode substrate 10 and the opposite substrate 40, is manipulated by applying an electric field to the droplet 51.

The above configuration makes it possible to provide, as the electronic device, an electrowetting device 1 which (i) includes a water repellent layer 18 whose adhesion to a base is higher than that of a conventional technique, (ii) can prevent the water repellent layer 18 from peeling off, and (iii) is more excellent in electrowetting performance than a conventional technique.

A method of producing an electrode substrate 10 in accordance with an eighth aspect of the present invention includes the steps of: (a) forming an active element (e.g., TFT 20) on an insulating substrate 11; (b) forming a first planarizing resin layer 13 which covers the active element; (c) forming, on the first planarizing resin layer 13, an electrode 14 connected to the active element via a contact hole 19; (d) forming a dielectric layer 15 which covers the electrode 14, the dielectric layer 15 including at least one second planarizing resin layer 16 and at least one ion barrier layer 17 which is made of an inorganic material; and (e) forming a water repellent layer 18 which covers the dielectric layer 15, in the step (d), the contact hole 19 being filled with the dielectric layer 15 which includes the at least one second planarizing resin layer 16.

The above method brings about an effect similar to that brought about by the first aspect of the present invention.

The present invention is not limited to the embodiments, but can be altered by a skilled person in the art within the scope of the claims. The present invention also encompasses, in its technical scope, any embodiment derived by combining technical means disclosed in differing embodiments. Further, it is possible to form a new technical feature by combining the technical means disclosed in the respective embodiments.

REFERENCE SIGNS LIST

1: Electrowetting device
2: Cell
10: Electrode substrate
11, 41: Insulating substrate
12: Thin film electronic circuitry layer
13: First planarizing resin layer
14, 42: Electrode
15: Dielectric layer
16: Second planarizing resin layer
17: Ion barrier layer
18, 43: Water repellent layer
19: Contact hole
20: TFT (active element)
21: Semiconductor layer
21*a*: Channel region
21*b*: Source region
21*c*: Drain region
22: Gate insulating film
23: First metal wire layer 23A: Gate electrode
24: Interlayer insulating film
25: Second metal wire layer
25A: Source electrode
25B: Drain electrode
26: Contact hole
31: Electrode array
32: Array element
33: Array element circuit
34: Row driving circuit
35: Column driving circuit
36: Serial interface
37: Voltage supplying interface
38: Connection wire
40: Opposite substrate
41: Insulating substrate
50: Internal space
51, 51A, 51B: Droplet
52: Non-ionic liquid

The invention claimed is:

1. An electrode substrate, comprising:
an insulating substrate;
an active element provided on the insulating substrate;
a first planarizing resin layer which covers the active element;
an electrode connected to the active element, via a contact hole which is secured in the first planarizing resin layer;
a dielectric layer which covers the electrode; and
a water repellent layer which covers the dielectric layer,
the dielectric layer including at least one second planarizing resin layer and at least one ion barrier layer which is made of an inorganic material,
the contact hole being filled with the dielectric layer including the at least one second planarizing resin layer.

2. The electrode substrate as set forth in claim 1, wherein:
the second planarizing resin layer is provided so as to cover the electrode outside the contact hole.

3. The electrode substrate as set forth in claim 2, wherein:
the ion barrier layer is provided on the second planarizing resin layer.

4. The electrode substrate as set forth in claim 2, wherein:
the ion barrier layer is provided between the electrode and the second planarizing resin layer.

5. The electrode substrate as set forth in claim 1, wherein:
the second planarizing resin layer is merely provided inside the contact hole; and
the ion barrier layer is provided so as to cover the second planarizing resin layer and the electrode.

6. An electronic device, comprising:
an electrode substrate recited in claim 1.

7. An electronic device as set forth in claim 6, further comprising:
an opposite substrate provided so as to be opposed to the electrode substrate,
the electronic device being an electrowetting device in which a droplet, placed between the electrode substrate and the opposite substrate, is manipulated by applying an electric field to the droplet.

8. A method of producing an electrode substrate, comprising the steps of:
(a) forming an active element on an insulating substrate;
(b) forming a first planarizing resin layer which covers the active element;
(c) forming, on the first planarizing resin layer, an electrode connected to the active element via a contact hole;
(d) forming a dielectric layer which covers the electrode, the dielectric layer including at least one second planarizing resin layer and at least one ion barrier layer which is made of an inorganic material; and
(e) forming a water repellent layer which covers the dielectric layer,
in the step (d), the contact hole being filled with the dielectric layer which includes the at least one second planarizing resin layer.

* * * * *